US008618826B2

(12) United States Patent
Cho

(10) Patent No.: US 8,618,826 B2
(45) Date of Patent: Dec. 31, 2013

(54) METHOD AND APPARATUS FOR DE-EMBEDDING

(75) Inventor: Hsiu-Ying Cho, Hsin Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 353 days.

(21) Appl. No.: 13/029,328

(22) Filed: Feb. 17, 2011

(65) Prior Publication Data
US 2011/0254576 A1  Oct. 20, 2011

Related U.S. Application Data

(63) Continuation-in-part of application No. 12/496,946, filed on Jul. 2, 2009, now Pat. No. 8,350,586.

(51) Int. Cl.
G01R 31/26 (2006.01)
G01R 31/02 (2006.01)

(52) U.S. Cl.
USPC ............ 324/762.01; 324/762.05; 324/762.03; 324/750.3; 438/18; 257/48; 29/825

(58) Field of Classification Search
USPC ............... 324/750.3, 762.01–762.05, 601; 438/18; 257/48, 774, 257/E21.521–E21.523, E23.179; 333/246, 333/247
See application file for complete search history.

(56) References Cited

U.S. PATENT DOCUMENTS

| 6,211,541 | B1 * | 4/2001 | Carroll et al. ................. 257/275 |
| 6,872,583 | B1 * | 3/2005 | Wu ................................ 438/18 |
| 6,878,964 | B1 * | 4/2005 | Lien et al. ..................... 257/48 |
| 7,157,926 | B1 * | 1/2007 | Hargrove et al. ........ 324/756.02 |
| 7,340,703 | B2 * | 3/2008 | Hegazy et al. ................ 716/115 |
| 7,446,017 | B2 * | 11/2008 | Liu et al. ...................... 438/455 |
| 2009/0216480 | A1 | 8/2009 | Kuo et al. |
| 2009/0224791 | A1 | 9/2009 | Yen et al. |
| 2011/0001504 | A1 | 1/2011 | Cho et al. |

OTHER PUBLICATIONS

Kolding et al., "Ground-shielded measuring technique for accurate on-wafer characterization of RF CMOS devices", Proc. IEEE Int. Microelectron. Test Structures Conf., pp. 106-111, 2000.*
Kaija et al., "The optimization of on-wafer shield-based test fixture layout", Microwave Theory and Techniques, IEEE Transactions on, vol. 54, No. 5, pp. 1975-1982, May 2006.*
Vandamme et al., "Improved Three-Step De-Embedding Method to Accurately Account for the Influence of Pad Parasitics in Silicon On-Wafer Rf Test-Structures," IEEE Transactions on Electron Devices, vol. 48, No. 4, pp. 737-742, Apr. 2001.*

(Continued)

*Primary Examiner* — Huy Q Phan
*Assistant Examiner* — James Split
(74) *Attorney, Agent, or Firm* — Haynes and Boone, LLP

(57) ABSTRACT

A short dummy test structure is disclosed, including a grounded shield layer above a substrate, at least two signal test pads, and a signal transmission line above the grounded shield layer and between the two signal test pads, wherein the signal transmission line is electrically coupled to the grounded shield layer. In one embodiment, the signal transmission line has a smaller total length than a total length of a corresponding signal transmission line and a device-under-test (DUT) of a test structure including the DUT. A de-embedding apparatus and method of de-embedding utilizing such a short dummy test structure are also disclosed.

20 Claims, 21 Drawing Sheets

(56) References Cited

OTHER PUBLICATIONS

Kolding, T.E. "Shield-based microwave on-wafer device measurements", Microwave Theory and Techniques, IEEE Transactions on, pp. 1039-1044 Volume: 49, Issue: 6, Jun. 2001.*

Kolding, T.E.; Iversen, Christian Rye "Simple noise deembedding technique for on-wafer shield-based test fixtures", Microwave Theory and Techniques, IEEE Transactions on, pp. 11-15 Volume: 51, Issue: 1, Jan. 2003.*

Kaija, T.; Ristolainen, Eero O. "An experimental study of scalability in shield-based on-wafer CMOS test fixtures", Microwave Theory and Techniques, IEEE Transactions on, pp. 945-953 Volume: 52, Issue: 3, Mar. 2004.*

Kaija, T.; Heino, P. "Shield-based on-wafer CMOS test fixture employing polysilicon shield plane", NORCHIP Conference, 2005. 23rd, pp. 118-121.*

Ming-Hsiang Cho; Guo-Wei Huang; Lin-Kun Wu; Chia-Sung Chiu; Yueh-Hua Wang; Kun-Ming Chen; Hua-Chou Tseng; Hsu, Tsun-Lai "A shield-based three-port de-embedding method for microwave on-wafer characterization of deep-submicrometer silicon MOSFETs", Microwave Theory and Techniques, IEEE Transactions on, pp. 2926-2934 vol. 53, Issue: 9, Sept.*

Hsiao-Tsung Yen et al., "A Physical De-Embedding Method for Silicon-Based Device Applications", Progress in Electromagnetics Research Symposium (PIERS), Beijing, China, Mar. 23-27, 2009, pp. 1339-1343.

* cited by examiner

Diagrammatic Top Level View

Diagrammatic Fragmentary Cross-Sectional Side View

Diagrammatic Top Level View

METHOD AND APPARATUS FOR DE-EMBEDDING

CROSS-REFERENCE TO RELATED APPLICATIONS

The present application is a continuation-in-part of U.S. application Ser. No. 12/496,946 filed Jul. 2, 2009, the full disclosure of which is incorporated by reference herein for all purposes.

TECHNICAL FIELD

The present disclosure relates generally to testing of a semiconductor device, and more particularly, to a method and apparatus of de-embedding.

BACKGROUND

Integrated circuits (ICs) formed on semiconductor substrates include multiple active and passive components, such as resistors, inductors, capacitors, transistors, amplifiers, etc. Such components are fabricated to a design specification that defines the ideal physical/electrical characteristics the component will exhibit (e.g., resistance, inductance, capacitance, gain, etc.). Though it is desirable to verify that each component fabricated complies with its specific design specification, typically, after integration into a circuit, an individual component cannot be readily tested. Thus, "stand-alone" copies of the individual IC components, components fabricated with the same process and with the same physical/electrical characteristics as the IC components, are fabricated on the wafer; and it is assumed that the physical/electrical properties measured for the "stand-alone" copies represent those of the non-tested individual IC components.

During testing, the "stand-alone" copy, referred to as the "device-under-test" (DUT), is electrically connected to leads and test pads, which are further connected to external testing equipment. Though the physical/electrical properties measured should accurately represent those of the DUT (and the individual IC component represented), the test pads and leads contribute physical/electrical characteristics, known as "parasitics" (e.g., resistance, capacitance, and inductance from the test pads and leads), that contribute to the measured characteristics of the DUT. The parasitics are factored out or extracted by a process known as "de-embedding" to reveal the intrinsic characteristics of the DUT.

Thus, accurate de-embedding methods are required to eliminate the parasitic contributions and to accurately describe the intrinsic characteristics of the DUT (and ultimately, the individual IC component represented). Currently, on-wafer de-embedding methods referred to as "open-short," "open-thru," and "thru-reflect-line" ("TRL") have been widely used to account for parasitics such as resistance, inductance, and capacitance arising from the test pads and leads at high frequencies (up to the GHz level). However, the current de-embedding methods suffer from problems such as short over de-embedding, excessive parasitic contributions from via holes and interconnections, and lack of three-dimensional de-embedding capabilities. These problems become more severe at high frequencies, such as frequencies in the neighborhood of 50 giga-hertz (GHz). Thus, while existing methods of de-embedding have been generally adequate for their intended purposes, they have not been entirely satisfactory in every aspect.

SUMMARY

One of the broader forms of the present disclosure involves a short dummy test structure. The short dummy test structure includes a grounded shield layer above a substrate, at least two signal test pads, and a signal transmission line above the grounded shield layer and between the two signal test pads, wherein the signal transmission line is electrically coupled to the grounded shield layer. In one embodiment, the signal transmission line has a smaller total length than a total length of a corresponding signal transmission line and a device-under-test (DUT) of a test structure including the DUT.

Another of the broader forms of the present disclosure involves an apparatus of de-embedding that includes a test structure including a device-under-test (DUT) coupled to a left signal pad by a first transmission line and a right signal pad by a second transmission line, and a short dummy test structure. The short dummy test structure includes a grounded shield layer above a substrate, at least two signal test pads, and a third signal transmission line above the grounded shield layer and between the two signal test pads. The third signal transmission line is electrically coupled to the grounded shield layer, and has a smaller total length than a total length of the first transmission line, the DUT, and the second transmission line.

Yet another of the broader forms of the present disclosure involves a method of de-embedding that includes forming a test structure including a device-under-test (DUT) coupled to a left signal pad by a first transmission line and a right signal pad by a second transmission line, and forming a plurality of dummy test structures. At least one dummy test structure is a short dummy test structure including a grounded shield layer above a substrate, at least two signal test pads, and a third signal transmission line above the grounded shield layer and between the two signal test pads, wherein the third signal transmission line is electrically coupled to the grounded shield layer, and wherein the third signal transmission line has a smaller total length than a total length of the first transmission line, the DUT, and the second transmission line. The method further includes measuring transmission parameters of the test structure and the dummy test structures including the short dummy test structure, and determining intrinsic transmission parameters of the DUT using the transmission parameters of the test structure and the plurality of dummy test structures including the short dummy test structure.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

Figure 1:
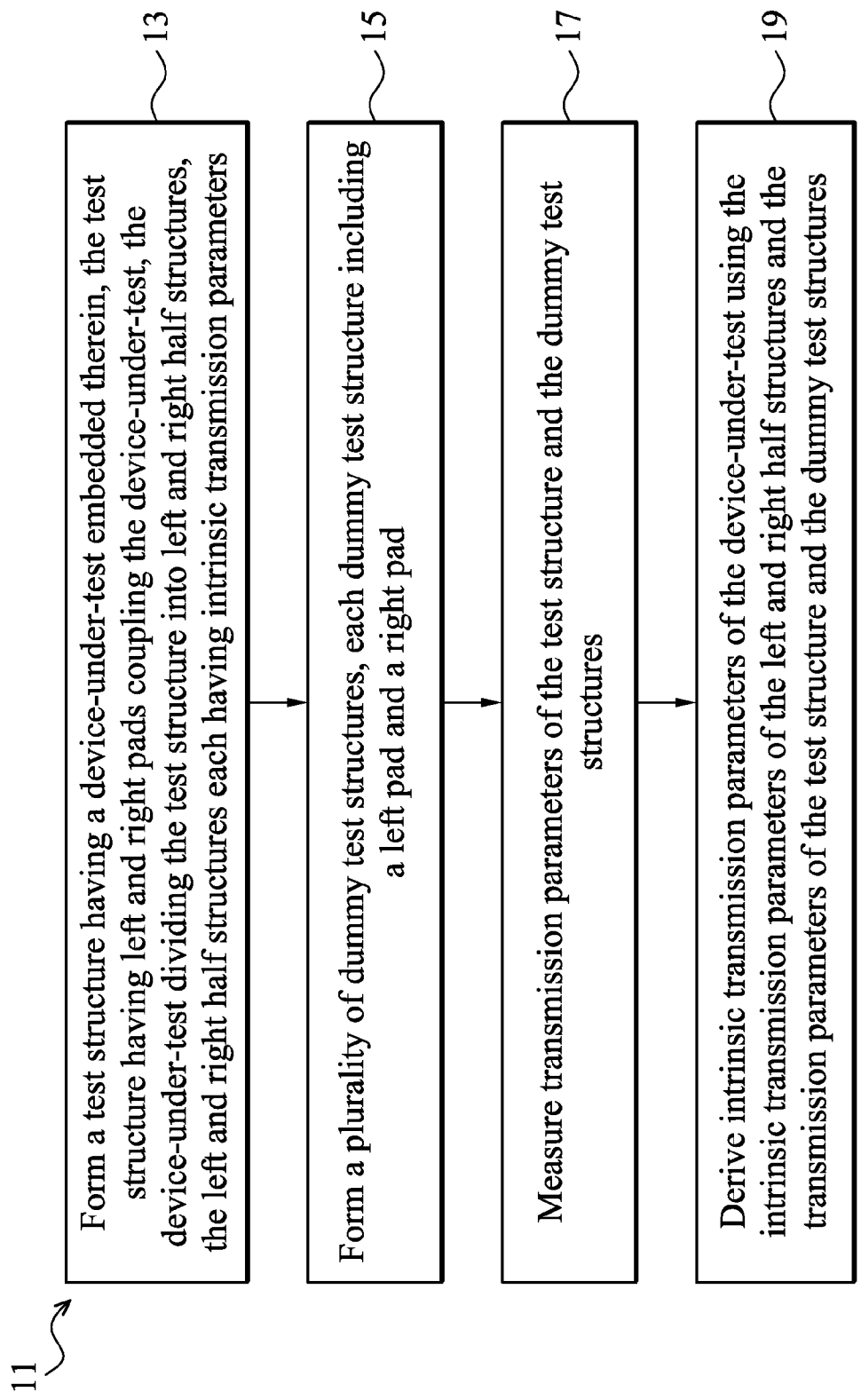
FIG. 1 is a flowchart illustrating a method of de-embedding according to various aspects of the present disclosure.

Illustrated in FIG. 1 is a flowchart of a method 11 of de-embedding according to various aspects of the present disclosure. Referring to FIG. 1, the method 11 begins with block 13 in which a test structure having a device-under-test embedded therein is formed. The test structure has left and right pads coupling the device-under-test. The device-under-test divides the test structure into left and right half structures. The left and right half structures each have intrinsic transmission parameters. The method 11 continues with block 15 in which a plurality of dummy test structures are formed. Each of the plurality of the dummy test structures includes a left pad and a right pad. The method 11 continues with block 17 in which transmission parameters of the test structure and the dummy test structures are measured. The method 11 continues with block 19 in which intrinsic transmission parameters of the device-under-test is derived using the intrinsic transmission parameters of the left and right half structures and the transmission parameters of the test structure and the dummy test structures.

Figure 2A:
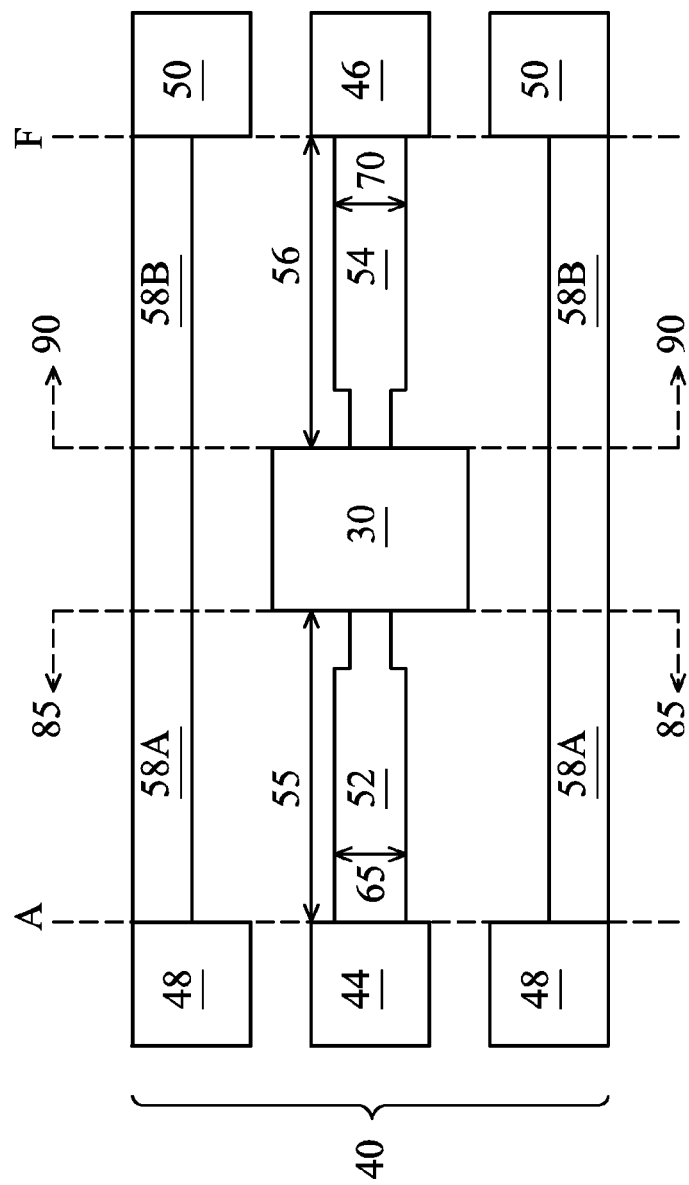
FIGS. 2A, 3A-3B, and 4A-4B are diagrammatic top views of various test structures used in the de-embedding method in accordance with FIG. 1.

FIGS. 2 to 4 illustrate Diagrammatic Top Level Views and/or Diagrammatic Fragmentary Cross Sectional Side Views of various test structures used in the de-embedding method in accordance with FIG. 1. Referring to FIG. 2A, a device-under test (DUT) 30 is embedded in a test structure 40. The DUT 30 includes an active or a passive radio frequency (RF) device in the present embodiment. For example, the DUT 30 may be a radio frequency integrated circuit (RFIC) device. The test structure 40 includes test pads 44, 46, 48 and 50. The test pads 44 and 46 include signal test pads, and the test pads 48 and 50 include ground test pads. In the present embodiment, the test pads 44 and 48 (as well as 46 and 50) are arranged in a ground-signal-ground (GSG) configuration, where the ground pads 48 are proximate to the signal pads 44. In alternate embodiments, the test structure 40 may be implemented with other configurations for the test pads 44 and 48, such as ground-signal (GS), ground-signal-ground-signal-ground (GSGSG), and/or any other suitable testing configurations. In one embodiment, the test structure 40 is designed and fabricated using a substrate-shielded technique known in the art, so that potential electromagnetic field radiation leakage to a semiconductor substrate (not illustrated) is reduced. In this substrate shielded technique, the test structure 40 is fabricated on the substrate and includes a bottom metal plane (not illustrated) that is grounded using denser via arrays to shield the silicon substrate. A feature of this implementation is that the test structure 40 may be regarded as an independent network without being coupled to other networks.

Referring back to FIG. 2A, the signal test pads 44 and 46 are electrically coupled to transmission lines 52 and 54 having lengths 55 and 56, respectively. The transmission lines 52 and 54 are also coupled to the DUT 30. Thus, electrical connections between the DUT 30 and external devices may be established. The ground test pads 48 and 50 are coupled to one another through conductive lines 58, which are transmission lines and may also be referred to as ground lines. The ground test pads 48 and ground lines 58 provide an electrical ground reference point for the DUT 30. The test pads 44 and 48, the transmission lines 52 and 54, and the ground lines 58 each include a conductive material such as aluminum, copper, aluminum-copper alloys, aluminum alloys, copper alloys, other metals, polysilicon, and/or combinations thereof. In the present embodiment, the signal test pads 44 and 46 and the ground test pads 48 and 50 have dimensions and materials that are approximately the same. It is understood that the test pads 44, 46, 48, and 50 may be coupled to an external device, such as a tester, so that electrical connections between the DUT 30 and the external device may be established. The transmission lines 52 and 54 also include widths 65 and 70, respectively. In the present embodiment, the widths 65 and 70 are both approximately equal to 0.4 microns (um), though the widths 65 and 70 may be greater than 0.4 um in other embodiments.

Figure 2B:
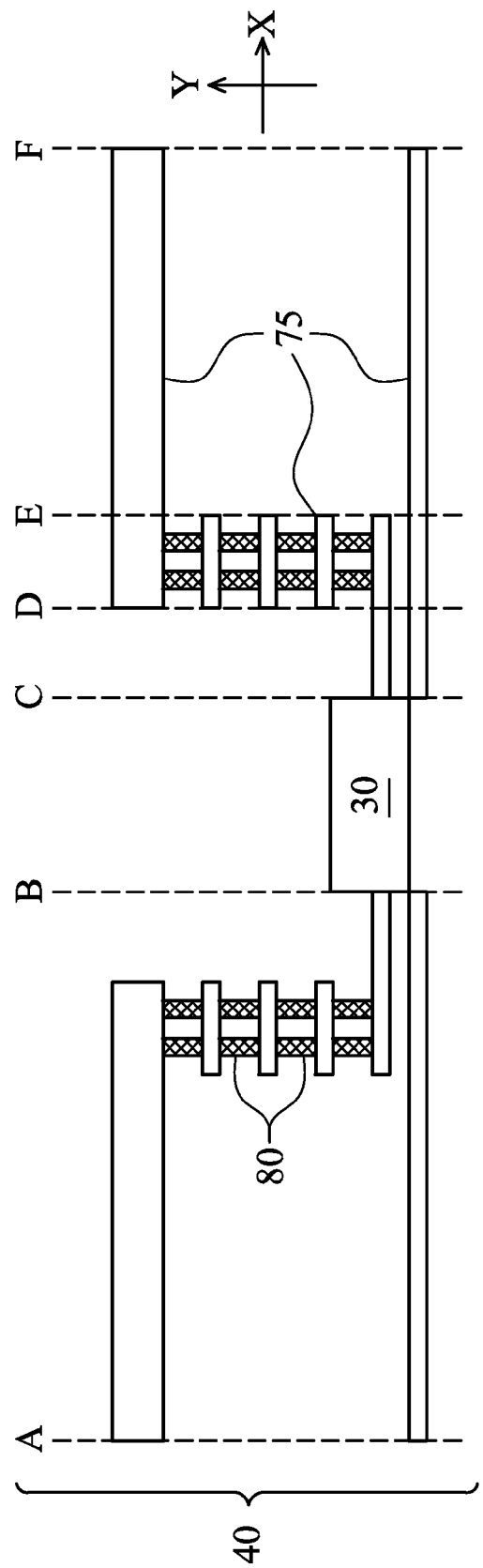
FIG. 2B is a diagrammatic cross-sectional side view of a test structure used in the de-embedding method in accordance with FIG. 1.

Referring now to FIG. 2B, a Diagrammatic Fragmentary Cross-Sectional Side View of the test structure 40 is illustrated. The test structure 40 includes a plurality of conductive layers 75 and vias 80 that are coupled to the DUT 30. The conductive layers 75 may also be known as inter-level metallization layers, which may exist in a plurality of semiconductor devices. The conducive layers 75 and the vias 80 include a conductive material such as metal, for example, aluminum, copper, aluminum-copper alloy, tungsten, or a combination thereof. The DUT 30 may be embedded in any one of the plurality of conductive layers 75 of the test structure 40. In the present embodiment, the conductive lines 75 and vias 80 together from point A to point B are represented by the transmission line 52 coupling the DUT 30 to the signal test pad 44 in FIG. 2A, and the conductive layers 75 and vias 80 together from point C to point F are represented by the transmission line 54 coupling the DUT 30 to the signal test pad 46 in FIG. 2A.

The DUT 30 has intrinsic transmission parameters that represent true physical/electrical characteristics of the DUT 30. When the DUT 30 is tested to measure these intrinsic transmission parameters, the components that couple to the DUT 30—such as the signal pads 44 and 46 and the transmission lines 52 and 54 shown in FIG. 2A—contribute parasitics, including parasitic resistance, parasitic capacitance, and parasitic inductance, to the measurement results, thus adversely affecting the accuracy of the measurements of the DUT 30. As such, various "de-embedding" methods have been utilized to extract the intrinsic transmission parameters of the DUT 30 from the measurement results of the DUT 30. However, as testing frequencies increase, the parasitic contributions of the components coupling to the DUT 30 become larger, which may render current de-embedding methods inaccurate. For example, referring to FIG. 2B, an electrical signal path from point C to point E may constitute as much as 40% of an electrical signal path from point C to point F of half of the test structure 40. It is very difficult for current de-embedding methods to account for the parasitic contributions arising from the electrical signal path from point C to point E of the test structure 40. In another example, a popular current de-embedding method utilizes an "open-short-through" approach, where in one aspect of the de-embedding, the DUT 30 is removed from the test structure 40, and an extra electrical short connection (not illustrated) is placed between point B and point C of the test structure 40. Since this electrical short connection may include metal and as such may contain resistance and inductance, it should not be de-embedded. However, the "open-short-through" de-embedding method does not take this into account and effectively de-embeds the electrical short connection from the measurement results anyhow. Consequently, the intrinsic transmission parameters of the DUT 30 obtained using the "open-short-through" de-embedding method are not accurate. This phenomenon is referred to as "short over de-embedding," which means the resistance and inductance values that are removed during de-embedding are higher than the correct values that should have been removed. The "short over de-embedding" problem becomes especially pronounced at higher frequencies, for example at frequencies equal to or greater than 50 GHz. The "short over de-embedding" problem also gets worse as the electrical short connection becomes longer.

To overcome the limitations of the current de-embedding methods, the present embodiment utilizes multiple test structures to obtain accurate results for the intrinsic transmission parameters of the DUT 30. One of these multiple test structures is the test structure 40. Referring back to FIG. 2A, the DUT 30 divides the test structure 40 into a left half structure 85 and a right half structure 90. The left half structure 85 has parasitic contributions that may be expressed in terms of intrinsic transmission parameters, which may be represented by an ABCD matrix (also referred to as a transmission matrix) [Left_half], and the right half structure 90 has parasitic contributions that may be expressed in terms of intrinsic transmission parameters, which may be represented by an ABCD matrix [Right_half]. In general, an ABCD matrix can be obtained for a two port network such as the two port network shown below.

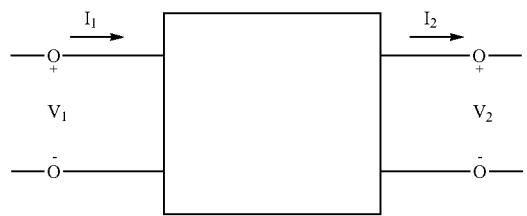

The ABCD matrix is defined in terms of the total voltages and currents such that:

$$V_1 = A*V_2 + B*I_2$$

$$I_1 = C*V_2 + D*I_2$$

$V_1$ and $V_2$ are input and output voltages of the two port network, respectively, and $I_1$ and $I_2$ are input and output currents of the two port network, respectively. Thus, A, B, C, D are elements of an ABCD matrix of the two port network, where A, B, C, D characterize relationships between input voltage $V_1$, output voltage $V_2$, input current $I_1$, and output current $I_2$. Putting the above equations in a matrix form, an ABCD matrix is obtained as:

$$\begin{bmatrix} V_1 \\ I_1 \end{bmatrix} = \begin{bmatrix} A & B \\ C & D \end{bmatrix} \begin{bmatrix} V_2 \\ I_2 \end{bmatrix}$$

The ABCD matrix may also be referred to as a transmission matrix, or transmission parameters of a two port network. A feature of the ABCD matrix is that, to calculate an ABCD matrix of two or more cascaded two port networks, the individual ABCD matrices of each network are multiplied. Similarly, to remove the ABCD matrix contributions of a two port network that is cascaded with other networks, the inverse matrix of that network is multiplied. Another feature of the ABCD matrix is that it can be obtained by measuring scattering parameters (S-parameters) of a two port network and then mathematically converting the S-parameter measurement results into an ABCD matrix. (For a more detailed discussion of ABCD matrices, refer to "Microwave Engineering, second edition" by David M. Pozar, pages 206-208). In the present embodiment, the length 55 of the transmission line 52 is approximately equal to the length 56 of the transmission line 54. Also recall that the test pads 44, 46, 48, and 50 all have approximately the same dimensions and include approximately the same materials. Thus, it may be said that the left half structure 85 is approximately symmetrical with the right half structure 90 in the present embodiment. Alternatively stated, the test structure 40 is a symmetrical test structure.

Since the signal test pad 44 and the ground test pads 48 are located to the "left" of the DUT 30 in FIG. 2, they may be referred to as left signal test pad 44 and left ground test pads 48, respectively. Similarly, the signal test pad 46 and the ground test pads 50 may be referred to as right signal test pad 46 and right ground test pads 50, respectively. The intrinsic transmission parameters (which represent the parasitic contributions) of the left signal test pad 44 and the left ground test pads 48 may be represented by an ABCD matrix [P_left], and the intrinsic transmission parameters of the right signal test pad 46 and right ground test pads 50 may be represented by an ABCD matrix [P_right]. It is understood that [P_left] and [P_right] take into account of potential discontinuity between a pad and an interconnect. In the present embodiment, since all the test pads 44, 46, 48, and 50 have approximately the same dimensions and include approximately the same materials, [P_left] is approximately equal to [P_right], and [P_left] and [P_right] may be collectively referred to as [Pad]. It is understood that in alternative embodiments, [P_left] may not be approximately equal to [P_right].

The test pads 44, 46, 48, and 50 may be coupled to a tester, so that transmission parameters of the entire test structure 40 may be obtained from measurement results. For example, using an instrument such as a network analyzer, the characteristics of the test structure 40 may be measured in terms of S-parameters. These S-parameter measurement results may then be converted to an ABCD matrix form, which is represented by [A']. For the ease of reference, intrinsic transmission parameters of the DUT 30 are referred to as [A]. It is understood that the intrinsic transmission parameters [A] of the DUT 30 may be obtained by taking the measured transmission parameters [A'] of the test structure 40, and removing (or extracting out) the intrinsic transmission parameters (or parasitic effects) of the left half structure 85 and the right half structure 90 from the measured transmission parameters [A']. Mathematically, this can be expressed as:

$$[A] = [\text{Left\_half}]^{-1} * [A'] * [\text{Right\_half}]^{-1} \quad \text{(equation 1)}$$

$[\text{Left\_half}]^{-1}$ and $[\text{Right\_half}]^{-1}$ are inverse matrices of [Left_half] and [Right_half], respectively. Since [A'] can be readily obtained from the measurement results of the test structure 40, only [Left_half] and [Right_half] need to be solved to calculate [A] and thus de-embed the DUT 30 out of the test structure 40 accurately. In FIG. 2A, it can also be seen that the left half structure 85 includes the left test pads 44, 48, and the transmission lines 52, 58A, and the right half structure 90 includes the right test pads 46, 50, and the transmission lines 54, 58B. Thus, the transmission parameters of the left half structure 85 can be obtained by cascading the transmission parameters of the pads 44, 48 and the transmission parameters of the transmission lines 52, 58A, and the transmission parameters of the right half structure 90 can be obtained by cascading the transmission parameters of the pads 46, 50 and the transmission parameters of the transmission lines 54, 58B. The transmission parameters of the transmission lines 52 and 58A in ABCD matrix form is [Thru_left], and the transmission parameters of the transmission lines 54 and 58B in ABCD matrix form is [Thru_right]. Thus, the following equations are obtained:

$$[\text{Left\_half}] = [P\_\text{left}] * [\text{Thru\_left}] \quad \text{(equation 2)}$$

$$[\text{Right\_half}] = [P\_\text{right}] * [\text{Thru\_right}] \quad \text{(equation 3)}$$

Thus, equation 1 can also be rewritten as $[A] = [P\_\text{left}]^{-1} * [\text{Thru\_left}]^{-1} * [A'] * [\text{Thru\_right}]^{-1} * [P\_\text{right}]^{-1}$.

Figure 3A:
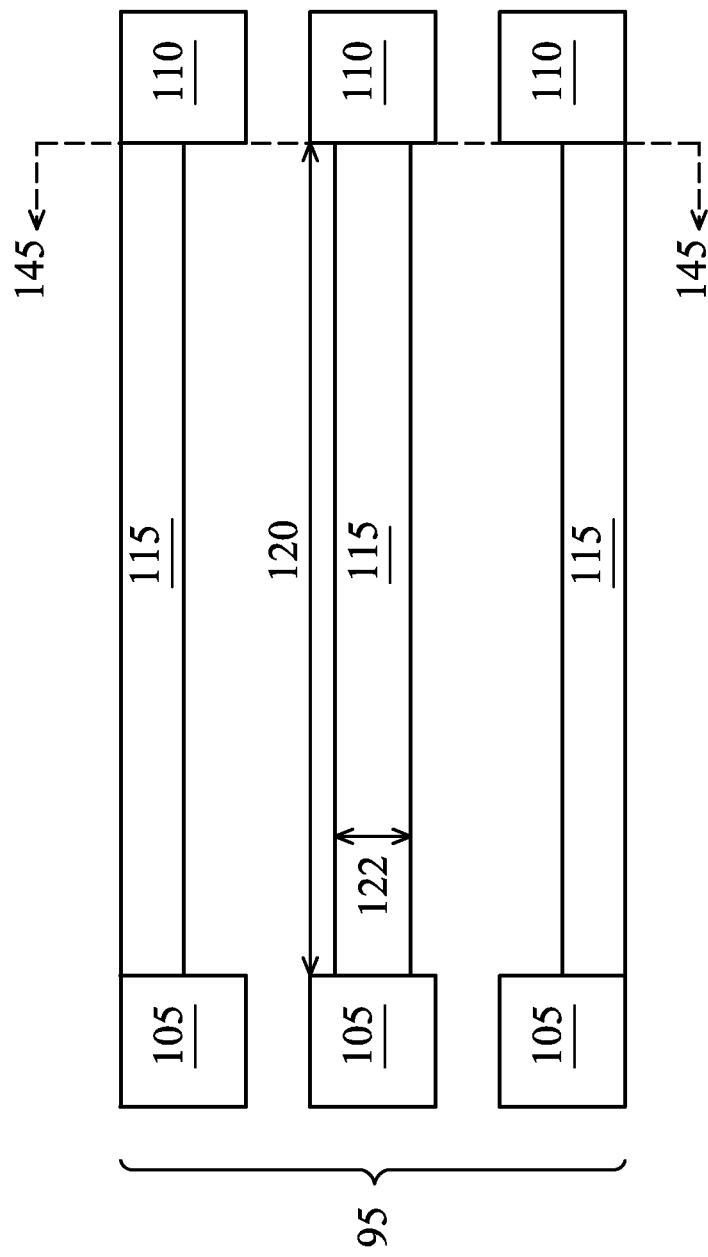
Figure 3B:
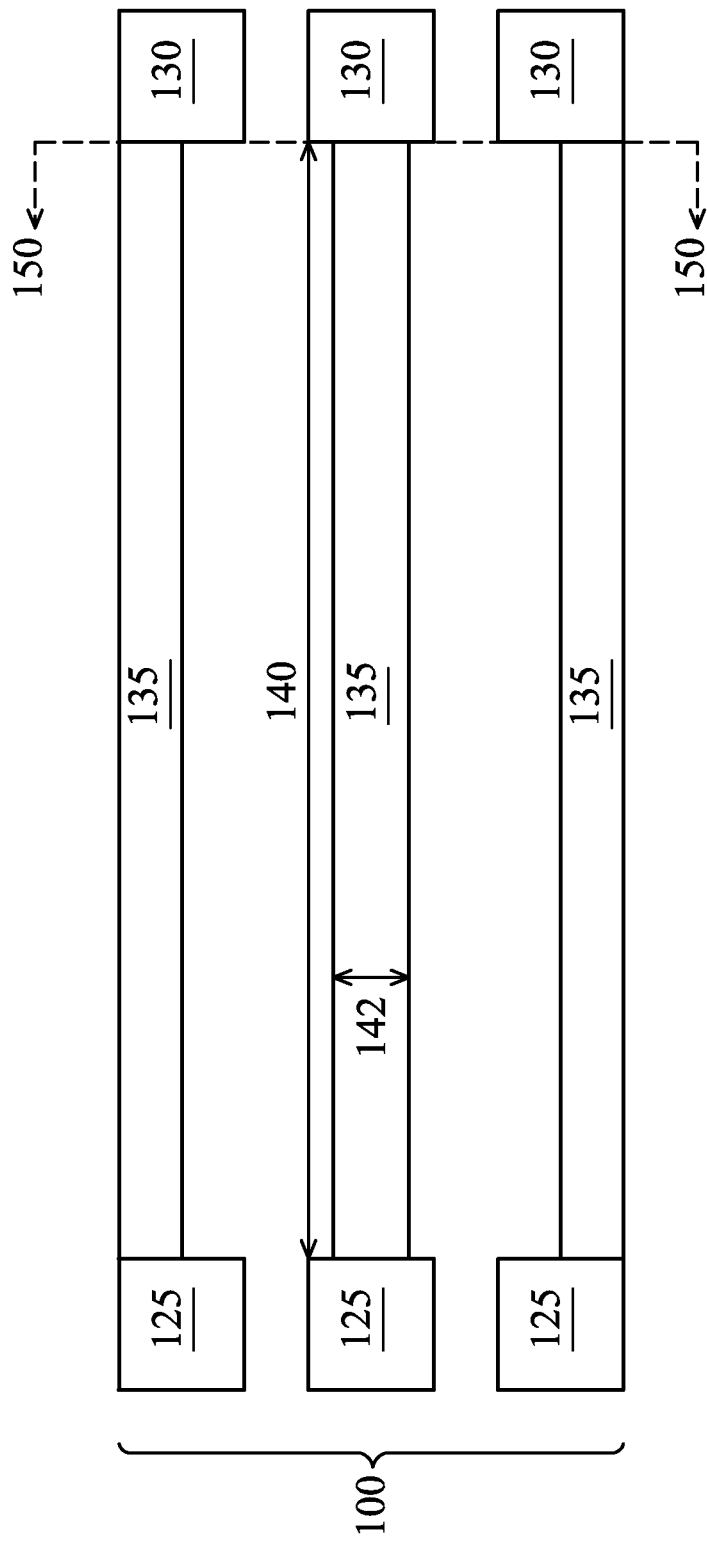

Referring now to FIGS. 3A and 3B, a dummy test structure 95 and a dummy test structure 100 are illustrated. In one embodiment, the dummy test structure 95 illustrated in FIG. 3A is designed and fabricated using the substrate-shielded technique described above. The dummy test structure 95 includes left test pads 105 and right test pads 110 arranged in a GSG configuration and coupled together by transmission lines 115 having a length 120 and a width 122. In an embodiment, the length 120 is greater than about 300 um, for example 500 um, and the width 122 is about 0.4 um, though the width 122 may be greater than 0.4 um in alternative embodiments. Parasitic contributions of the transmission lines 115 may be expressed in terms of intrinsic transmission parameters and may be represented by an ABCD matrix [M_l]. In the present embodiment, the left test pads 105 and the right test pads 110 have dimensions and include materials that are approximately the same as the dimensions and materials of the test pads 44, 46, 48, and 50 of the test structure 40 shown in FIG. 2A, respectively. Thus, the left test pads 105 and right test pads 110 have transmission parameters (or parasitic contributions) that are approximately equal to [P_left] and [P_right], respectively (which are approximately equal to each other in the present embodiment).

In one embodiment, the dummy test structure 100 illustrated in FIG. 3B is designed and fabricated using a substrate-shielded technique described above. The dummy test structure 100 includes left test pads 125 and right test pads 130, which are arranged in a GSG configuration and coupled together by transmission lines 135 having a length 140 and a width 142. In an embodiment where the length 120 of the transmission lines 115 is about 500 um, the length 140 of the transmissions 135 is about 1000 um Parasitic contributions of the transmission line 135 may be expressed in terms of intrinsic transmission parameters and may be represented by an ABCD matrix [M_2l]. In the present embodiment, the left test pads 125 and the right test pads 130 have dimensions and include materials that are approximately the same as the dimensions and materials of the test pads 44, 46, 48, and 50 of the test structure 40 shown in FIG. 2A, respectively. Thus, the left test pads 125 and right test pads 130 have transmission parameters (or parasitic contributions) that are approximately equal to [P_left] and [P_right], respectively. The length 140 of the transmission line 135 is approximately equal to N times the length 120 of the transmission line 115. In the present embodiment, N=2, meaning that the length 140 of the transmission line 135 is about twice the length 120 of the transmission line 115. It is also known that ABCD matrices may be cascaded. Hence, the transmission parameters [M_2l] of the transmission line 135 are approximately equal to [M_l]*[M_l].

The test pads 105 and 110 of the dummy test structure 95 may each be coupled to external testing equipment so that the transmission parameters of the dummy test structure 95 may be measured. The measurement of the transmission parameters may be done using S-parameters, and the measurement results may then be converted into an ABCD matrix format, so that the measured transmission parameters (in an ABCD matrix form) of the dummy test structure 95 may be obtained, which is expressed as [TL_l1]. Similarly, the measured transmission parameters in an ABCD matrix form of the dummy test structure 100 may be obtained and may be expressed as [TL_l2]. The following equations are then obtained:

$$[TL\_l1] = [P\_\text{left}] * [M\_l] * [P\_\text{right}] \quad \text{(equation 4)}$$

$$[TL\_l2] = [P\_\text{left}] * [M\_2l] * [P\_\text{right}] \quad \text{(equation 5)}$$
$$= [P\_\text{left}] * [M\_l] * [M\_l] * [P\_\text{right}]$$

Through mathematical manipulations of the above equations, [P_left] or [P_right] and [M_l] may be solved and expressed by the following equations:

$$[P\_\text{left}] * [P\_\text{right}] = [TL\_l1] * [TL\_l2]^{-1} * [TL\_l1] \quad \text{(equation 6)}$$

$$[M\_l] = [P\_\text{left}]^{-1} * [TL\_l1] * [P\_\text{right}]^{-1} \quad \text{(equation 7)}$$

Since [TL_l1] and [TL_l2] are obtained from measurement results, [P_left], [P_right] and [M_l] can be accurately calculated. In one embodiment, the following results for [P_left] and [P_right] are calculated:

$$[P\_\text{left}] = \begin{bmatrix} 1 & B/2 \\ C/(1+(A+D)/2) & 1+BC/2(1+(A+D)/2) \end{bmatrix} \quad \text{(equation 8)}$$

$$[P\_\text{right}] = \begin{bmatrix} 1+BC/2(1+(A+D)/2) & B/2 \\ C/(1+(A+D)/2) & 1 \end{bmatrix} \quad \text{(equation 9)}$$

where A, B, C, and D represent the elements of the ABCD matrix for the test structure 40. The ABCD parameters may be obtained by measuring the S-parameters of the test structure 40 and then mathematically converting these S-parameters into ABCD parameters.

As described previously, [P_left] represents the intrinsic transmission parameters (or parasitic contributions) of one of the left test pads 105, 125, 44, and 48. [P_right] represents the intrinsic transmission parameters (or parasitic contributions) of one of the right test pads 110, 130, 46 and 50, respectively. [M_l] represents the intrinsic transmission parameters (or parasitic contributions) of a transmission line having a length approximately equal to length 120 of the transmission line 115. Using equations 8 and 9, [Thru_left] and [Thru_right] can also be calculated. Thereafter, using equations 2 and 3, [Left_half] and [Right_half] can be calculated. In one embodiment, the lengths 55 and 56 of the transmission lines 52 and 54, respectively, are approximately equal to the length 120 of the transmission line 115. Thus, [Thru_left] and [Thru_right] are approximately equal to [M_1]. Since [M_1] can be calculated using equations 4-9, [Thru_left] and [Thru_right] may also be obtained.

Further, the intrinsic transmission parameters of the left test pads 105 cascaded with the transmission line 115 may be expressed in ABCD matrix form as [TL_left1]. [TL_left1] can also be obtained by multiplying the measured transmission parameters [TL_l1] by $[P\_right]^{-1}$, since [TL_left1] represents intrinsic transmission parameters of a structure 145 that is essentially the same as the dummy test structure 95 without its right test pads 110. For the sake of illustration, the structure representing [TL_left1] is denoted by the arrows and dashed lines drawn over the dummy test structure 95. Similarly, intrinsic transmission parameters of the left test pads 125 cascaded with the transmission line 135 represents intrinsic transmission parameters [TL_left2] of a structure 150 that is essentially the same as the dummy test structure 100 without its right test pads 130. For the sake of illustration, the structure representing [TL_left2] is denoted by the arrows and dashed line drawn over the dummy test structure 100. [TL_left2] may also be obtained by multiplying the measured transmission parameters [TL_l2] by $[P\_right]^{-1}$, where $[P\_right]^{-1}$ represents an inverse matrix of [P_right].

Figure 4A:
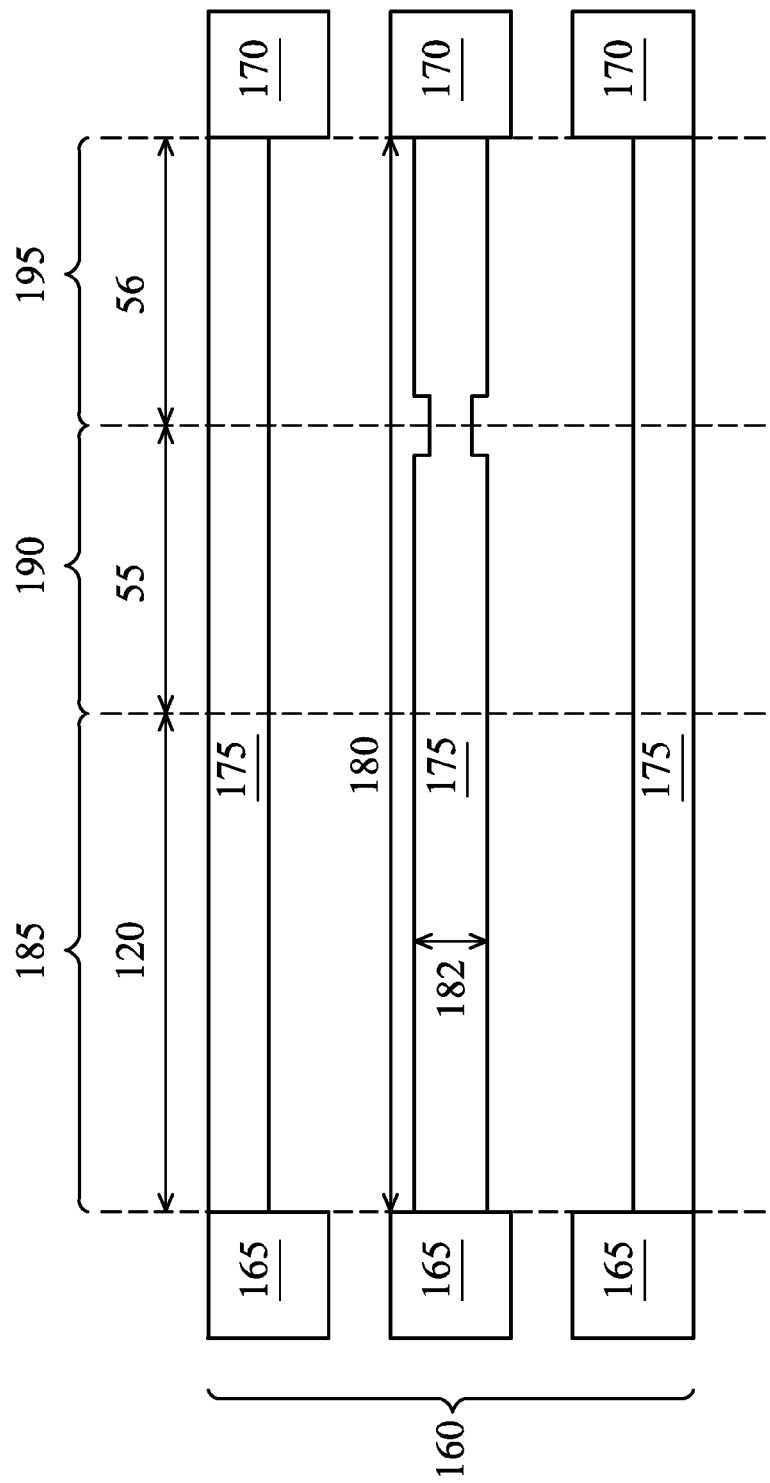
Figure 4B:
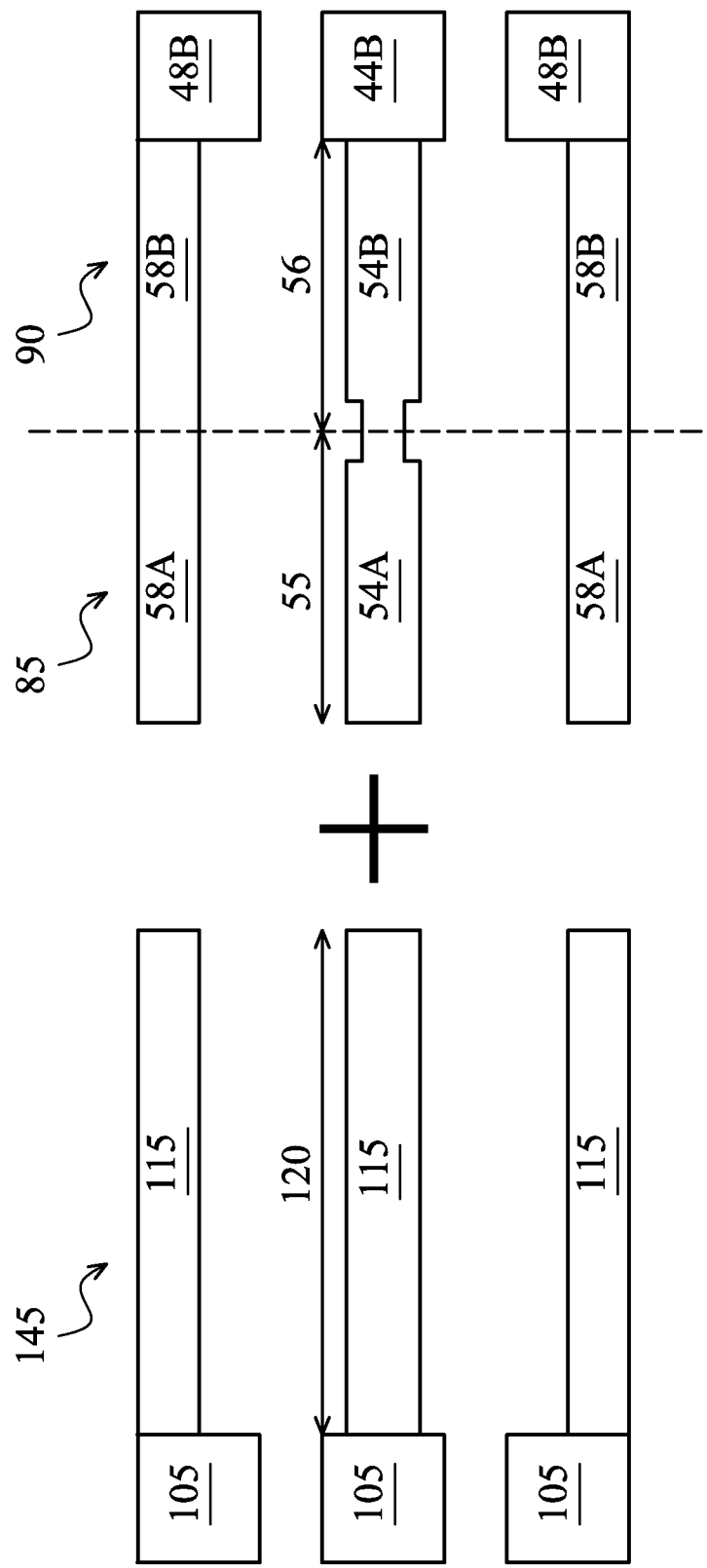

Referring now to FIG. 4A, a dummy test structure 160 is illustrated. In one embodiment, the dummy test structure 160 is designed and fabricated using a substrate-shielded technique described above. The dummy test structure 160 includes left test pads 165 and right test pads 170 arranged in a GSG configuration and coupled by transmission lines 175 having a length 180 and a width 182. In an embodiment, the width 182 is about 0.4 um, though the width 182 may be greater than 0.4 um in alternative embodiments. The test pads 165 and 170 may be coupled to an external tester to obtain measurement results of the transmission parameters of the entire dummy test structure 160. For example, S-parameters may be measured, which may then be converted to an ABCD matrix [THRU], where [THRU] represents the measured transmission parameters (or parasitic contribution) of the entire dummy test structure 160. The transmission line 175 may be conceptually decomposed into three segments—segment 185, segment 190, and segment 195. In the present embodiment, the segment 185 has a length that is approximately equal to the length 120 of the transmission line 115 of the dummy test structure 95 in FIG. 3A. In an alternative embodiment, the segment 185 has a length that is approximately equal to the length 140 of the transmission line 135 of the dummy test structure 100 in FIG. 3B.

Referring back to FIG. 4A, the segment 190 has a length that is approximately equal to the length 55 of the transmission line 52 of the test structure 40 in FIG. 2A, and the segment 195 has a length that is approximately equal to the length 56 of the transmission line 54 of the test structure 40. Thus, the length 180 of the transmission line 175 is approximately equal to a sum of the length 120, the length 55, and the length 56. In addition, the dummy test structure 160 may be conceptually decomposed into the following structures illustrated in FIG. 4B: the structure 145 (which is the dummy test structure 95 without the right pads 110) in FIG. 3A, the left half structure 85 in FIG. 2A without its left pads 44 and 48, and the right half structure 90 in FIG. 2A. Mathematically, this decomposition may be expressed as the following:

$$[THRU]=[TL\_left1]*[Left\_half]*[P\_left]^{-1}*[Right\_half]. \quad \text{(equation 10)}$$

Recall that [THRU] can be readily obtained from the measurement results of the dummy test structure 160, and [P_left] can be calculated using the dummy test structures 95 and 100 and conducting mathematical manipulations, and that [TL_left1] can also be calculated either as $[TL\_l1]*[P\_right]^{-1}$ or $[P\_left]*[M\_l]$. Thus, [Left_half] and [Right_half] may be solved.

Once [Left_half] and [Right_half] are obtained, using equation 1 where $[A]=[Left\_half]^{-1}*[A']*[Right\_half]^{-1}$, [A] (the intrinsic transmission parameters of the DUT 30) can be solved. The solved intrinsic transmission parameters of the DUT 30 represent the true transmission characteristics of the DUT 30, free from the parasitic contributions of pads and transmission lines coupling the DUT 30 to external devices.

Using the test structures 40, 95, 100, and 160, the following sequences of actions summarize one embodiment of de-embedding:

1) Measure the scattering matrices of the transmission line 115 having the length 120, the transmission line 135 having the length 140, the test structure 160, and the test structure 40.
2) Convert the scattering matrices of the transmission lines 115 and 135 and the test structures 160 and 40 to their ABCD matrices [M_l], [M_2l], [THRU], and [A], respectively.
3) Calculate the ABCD matrices of the left-side test pads 44, 48 and the right-side test pads 46, 50, to obtain [P_left] and [P_right], respectively.
4) Calculate the ABCD matrices of the transmission lines 52 and 54 to obtain [Thru_left] and [Thru_right], respectively.
5) Calculate the ABCD matrix [A] to obtain the intrinsic transmission parameters of the DUT 30.

In the present embodiment, the test structures 40, 95, 100 and 160 are formed on the same semiconductor wafer. The test structures 40, 95, 100, and 160 are also fabricated using the same technologies and processes (for example, a 65 nm RF-CMOS technology) in the present embodiment. It is also understood that the DUT 30 may be formed along with the forming of the test structure 40. In alternative embodiments, the test structures 40, 95, 100, and 160 may be fabricated using different processes and be formed on different wafers.

It is also understood that the test structures 40, 95, 100, and 160 may each have a three-dimensional structure. In some embodiments, the parasitic components such as transmission lines and/or pads that need to be de-embedded may not be located on the same two-dimensional layer level. For example, as is illustrated in FIG. 2B, the transmission from point D to point F extends along an X-axis, whereas the vias and metal layers from point C to point D extends not only along the X-axis but also a Y-axis. Since the transmission line from point D to point F also has a width (not observable in FIG. 2B but can be observed in FIG. 2A), the transmission line from point D to point F is already a two-dimensional feature. Since the transmission line from point C to point F (transmission line 54) includes an extra dimension (the Y-axis), the transmission line 54 is a three-dimensional feature. Traditional methods of de-embedding have had difficulties in de-embedding three-dimensional features such as the transmission line 54 shown in FIG. 2B, but such difficulties can be overcome using the methods and structures described above.

In some embodiments, coplanar waveguides (CPW) are used as the various transmission lines of test structures 40, 95, 100, and 160. As described previously, a semiconductor device may include a plurality of inter-level metallization layers. These CPW features may be placed on any of the inter-level metallization layers. Measurements (such as S-parameter measurements) may be made directly on the CPW features to prevent layout mismatch between the measured parasitics of the dedicated de-embedding dummy structures (such as test structures 95, 100, and 160) and the test structure having the DUT embedded therein (such as the test structure 40). This technique allows more accurate transmission line modeling. As an example, Table I. below lists several different types of transmission lines that may be used.

TABLE I

| Name | Transmission Line Type | Metal Shield Layer | Strip Length | Strip Space | Shield Type |
|---|---|---|---|---|---|
| CPW | CPW | No strip shields | | | |
| FSCPW1 | Floating slow-wave CPW | M9, M7 | 0.1 um | 0.1 um | Floating |
| FSCPW2 | Floating slow-wave CPW | M9, M7 | 0.1 um | 0.9 um | Floating |
| FSCPW3 | Floating slow-wave CPW | M9, M2 | 0.1 um | 0.1 um | Floating |
| GSCPW1 | Grounded slow-wave CPW | M9, M7 | 0.1 um | 0.1 um | Grounded |
| GSCPW2 | Grounded slow-wave CPW | M9, M7 | 0.1 um | 0.9 um | Grounded |
| GSCPW3 | Grounded slow-wave CPW | M9, M2 | 0.1 um | 0.1 um | Grounded |

Figure 5A:
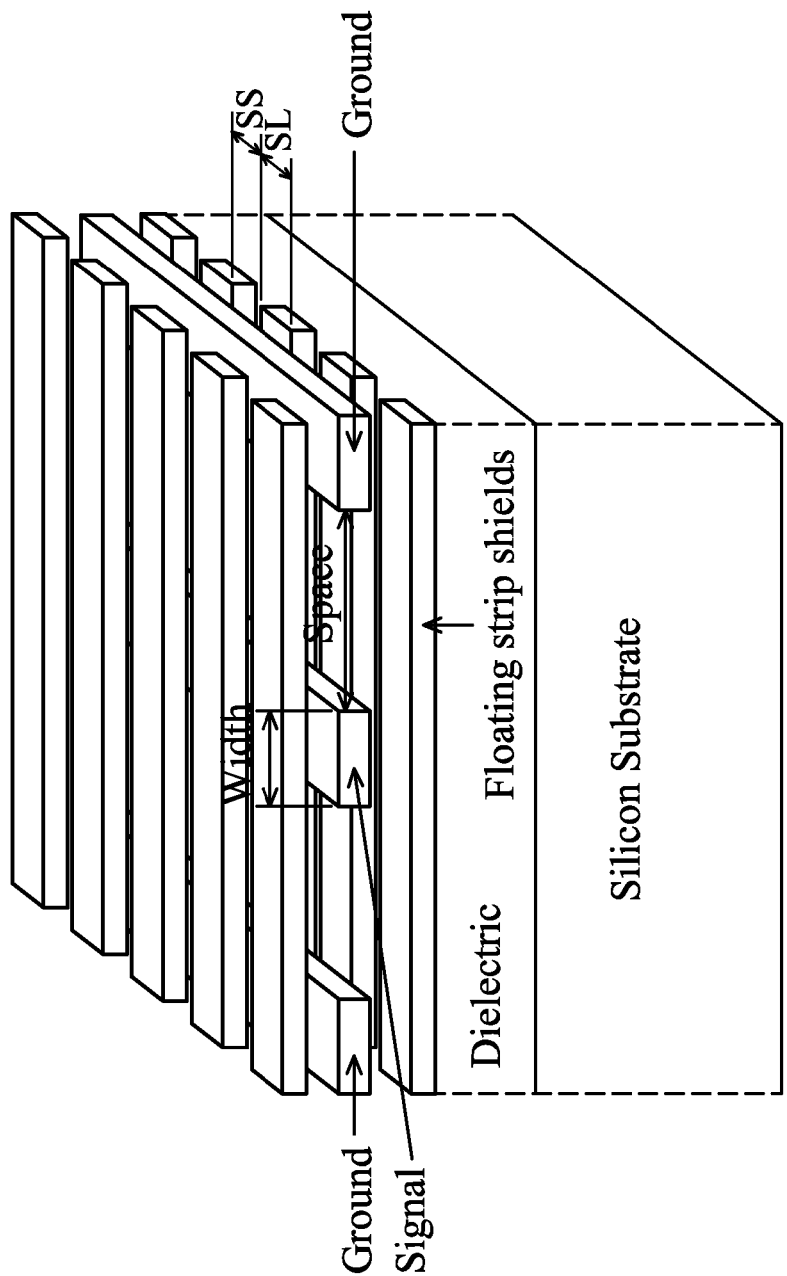
FIGS. 5A-5B are diagrammatic three-dimensional (3-D) views of a slow-wave CPW transmission line with slot-type floating shields and a slow-wave CPW transmission line with slot-type grounded shields, respectively, according to various aspects of the present disclosure.
Figure 5B:
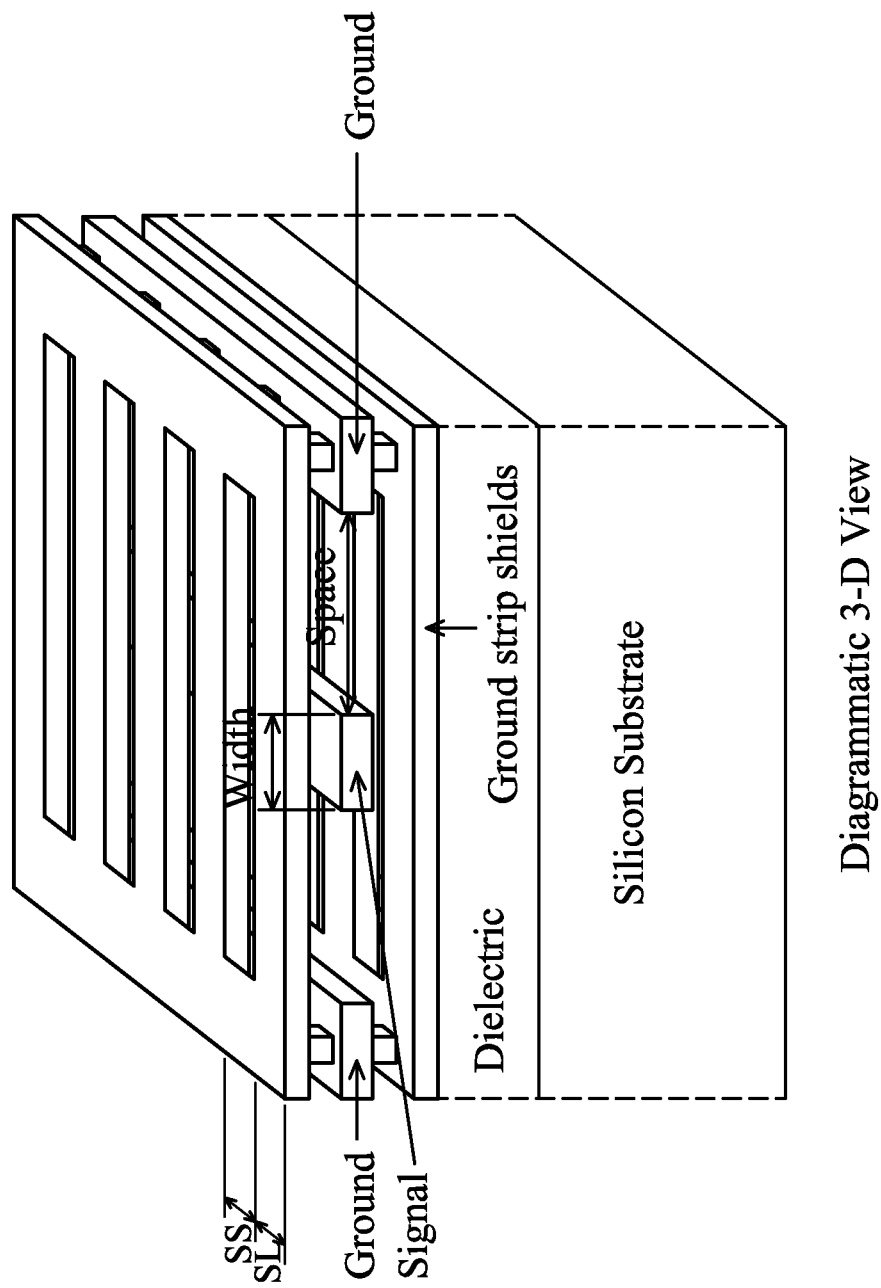

CPW in table I is a coplanar waveguide transmission line without shields, FSCPW1-FSCPW3 are transmission lines with slot-type floating shields, and GSCPW1-GSCPW3 are transmission lines with slot-type grounded shields. Referring to FIGS. 5A and 5B, diagrammatic three-dimensional views of a slow-wave CPW transmission line with slot-type floating shields and a slow-wave CPW transmission line with slot-type grounded shields are illustrated, respectively. In FIG. 5A, a slow-wave CPW transmission line with slot-type floating shields may be designed with periodically slot-type floating shields located both above and below the CPW structure and the slot-type floating shields are oriented transversely to the CPW structure. In one embodiment, for all transmission lines in Table I, the CPW structure is formed on an eighth (M8) metal layer and the slot-type shields are created on either a seventh (M7) or a second (M2) metal layer. The CPW part of the structure has a signal/ground line width of 10 um/10 um, with a 20 um space between signal and ground lines. The upper strip shields with a fixed strip length (SL) of 2 um and a fixed strip space (SS) of 2 um, and the lower strip shields have a variable SL and a variable SS. The SL may be designed to be the minimum length to achieve a high performance with minimized eddy-current loss. The minimum length on M7 and M2 is 0.1 um for a 65 nm CMOS technology. The lower slot-type floating shields are designed with the following dimension splits, (1) the SL on M7 is 0.1 um and the accompanying SS is either 0.1 um or 0.9 um, and (2) the SL on M2 is 0.1 um and the accompanying SS is 0.1 um. In FIG. 5B, for the grounded slow-wave CPW transmission line, it is designed with the similar structure as that of the slow-wave CPW transmission line with floating shields as described above, but with the slot-type shields connected to the ground. In one embodiment, all of the test structures described above have the same length of 500 um and width of 80 um.

Figure 6:
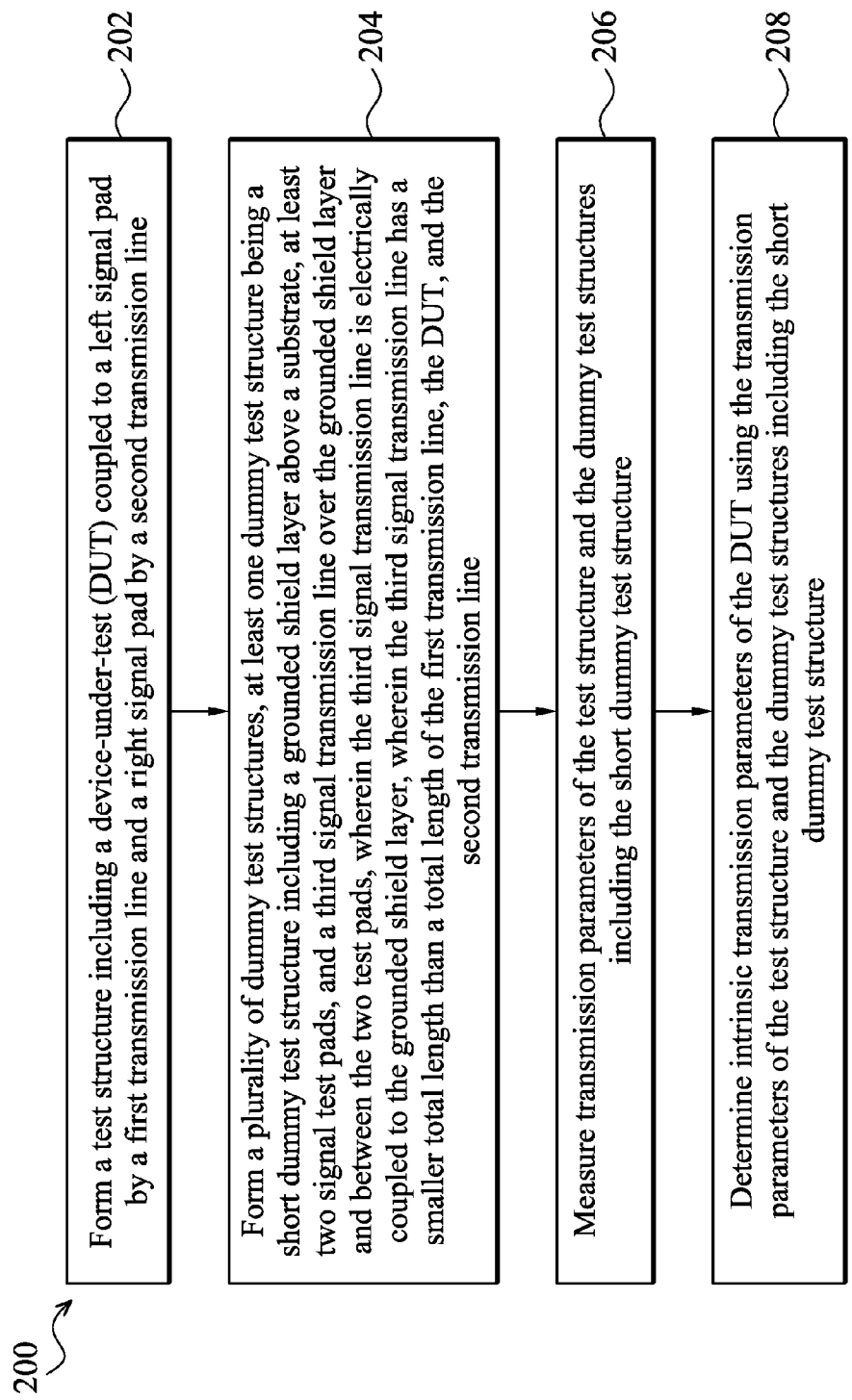
FIG. 6 is a flowchart illustrating a method of de-embedding according to another embodiment of the present disclosure.

Referring now to FIG. 6, a flowchart illustrates a method of de-embedding 200 according to an embodiment of the present disclosure. Method 200 begins with block 202 in which a test structure is formed, the test structure including a device-under-test (DUT) coupled to a left signal pad by a first transmission line and a right signal pad by a second transmission line.

The method continues with block 204 in which a plurality of dummy test structures are formed, with at least one dummy test structure being a short dummy test structure. The short dummy test structure is formed to include a grounded shield layer above a substrate, at least two signal test pads, and a third signal transmission line disposed above the grounded shield layer and between the two signal test pads. The third signal transmission line is electrically coupled to the grounded shield layer, and also has a smaller total length than a total length of the first transmission line, the DUT, and the second transmission line.

In accordance with various embodiments of the present disclosure, the entirety of the third signal transmission line may be formed above the grounded shield layer, the third signal transmission line may be formed to have a total length of about a combined length of the first transmission line and the second transmission line, and/or the third signal transmission line may be formed to include a plurality of vias and a plurality of conductive layers, wherein the third signal transmission line is electrically coupled to the grounded shield layer by at least one via.

The method continues with block 206 in which transmission parameters of the test structure and the dummy test structures including the short dummy test structure are measured. The method further includes determining intrinsic transmission parameters of the DUT using the transmission parameters of the test structure and the plurality of dummy test structures including the short dummy test structure. In accordance with various embodiments of the present disclosure, the intrinsic transmission parameters of the DUT may be determined using an open-short de-embedding technique, an open-short-through de-embedding technique, or various other de-embedding techniques in conjunction with advantageous short dummy test structures of the present disclosure. Various de-embedding techniques are described in U.S. application Ser. No. 12/037,333, the disclosure of which is incorporated by reference herein for all purposes.

It is noted that similar features may be similarly numbered herein for the sake of simplicity and clarity. It is further noted that additional processes may be provided before, during, and after the method 200 of FIG. 6, and that some other processes may only be briefly described herein.

Referring now to FIGS. 7A through 7C and 8A through 8C, top views of various corresponding test structures 300, 320, 350 and 400, 420, 450, respectively, are illustrated in accordance with embodiments of the present disclosure. Referring also to FIGS. 9A and 9B, a perspective view and a cross-sectional side view are illustrated, respectively, of a short dummy test structure 550 in accordance with an embodiment of the present disclosure. These test structures may be used in the de-embedding method of FIG. 6 in one embodiment.

Figure 7A:
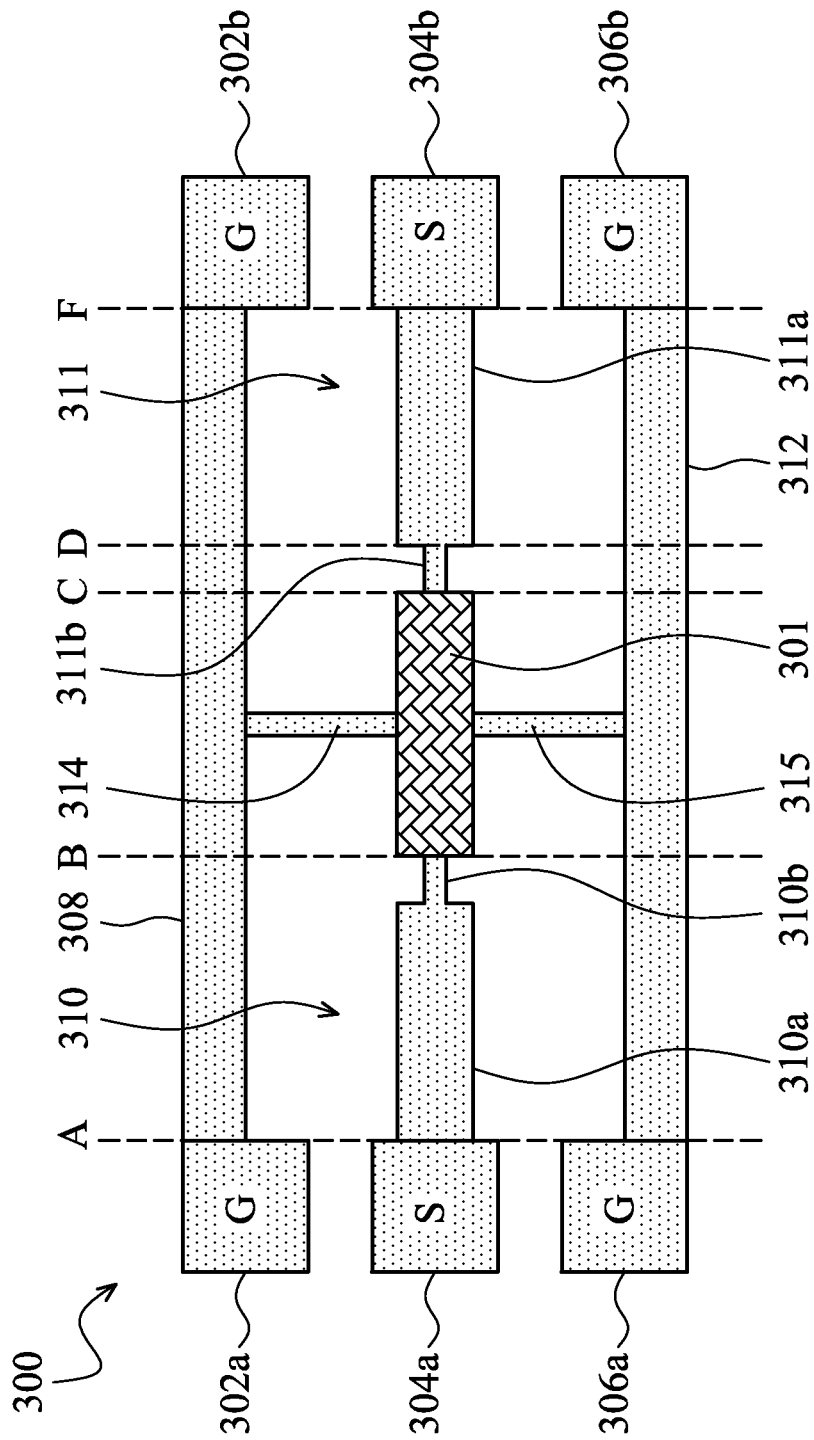
FIGS. 7A-7C are top views of various test structures in accordance with embodiments of the present disclosure.
Figure 8A:
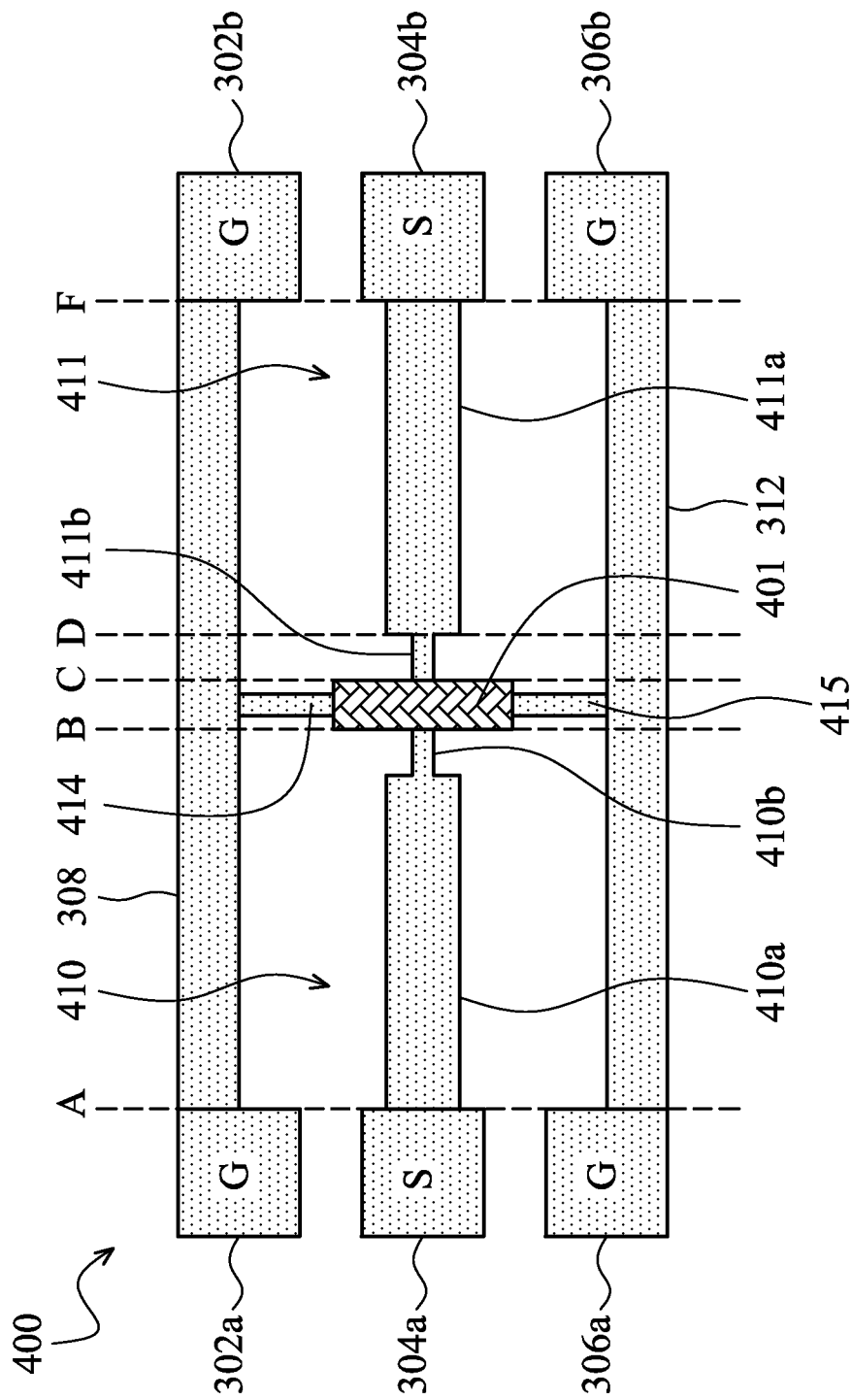
FIGS. 8A-8C are top views of various test structures in accordance with embodiments of the present disclosure.
Figure 9A:
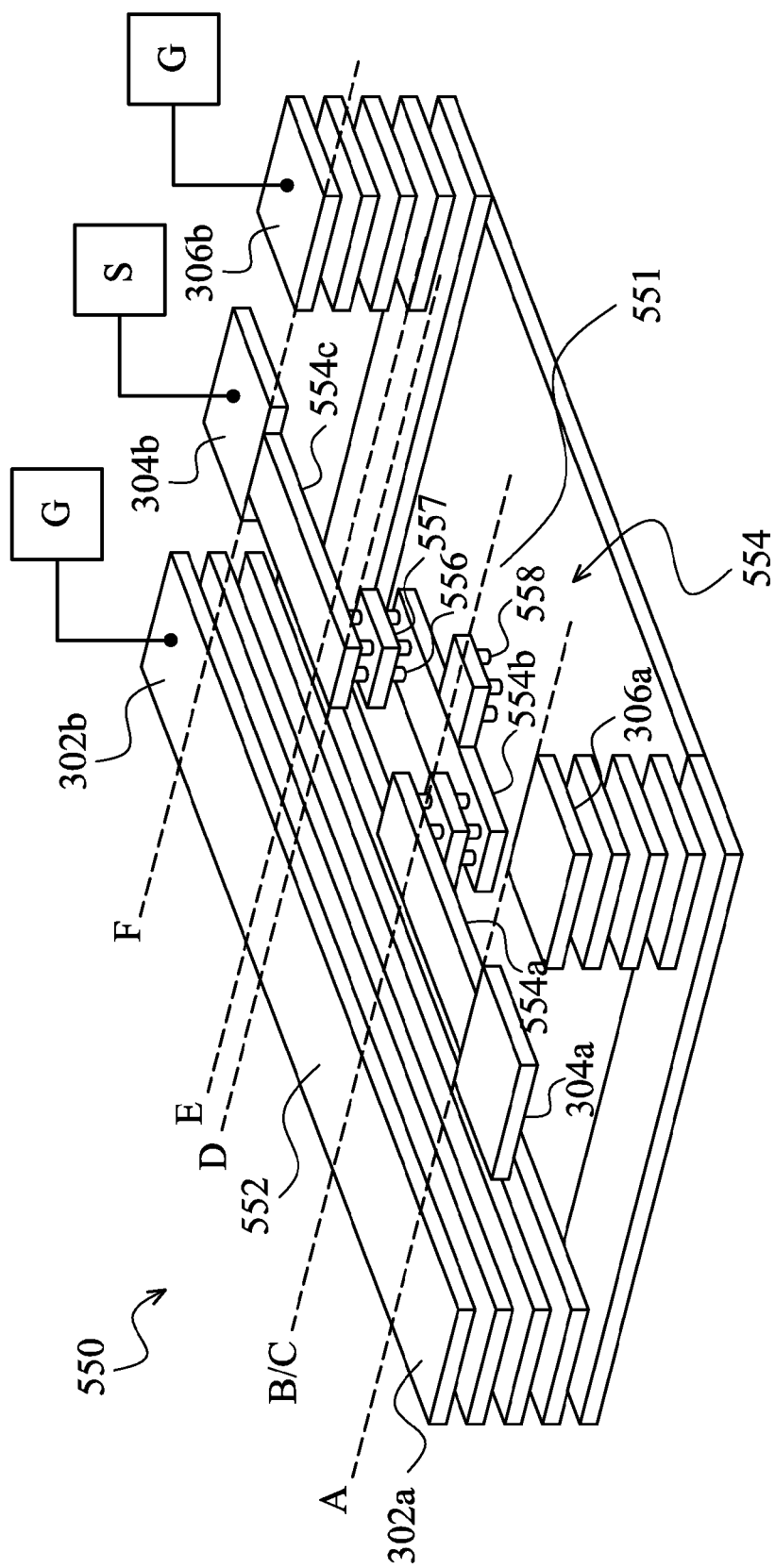
FIGS. 9A-9B are a perspective view and a cross-sectional side view of a short dummy test structure in accordance with an embodiment of the present disclosure.
Figure 9B:
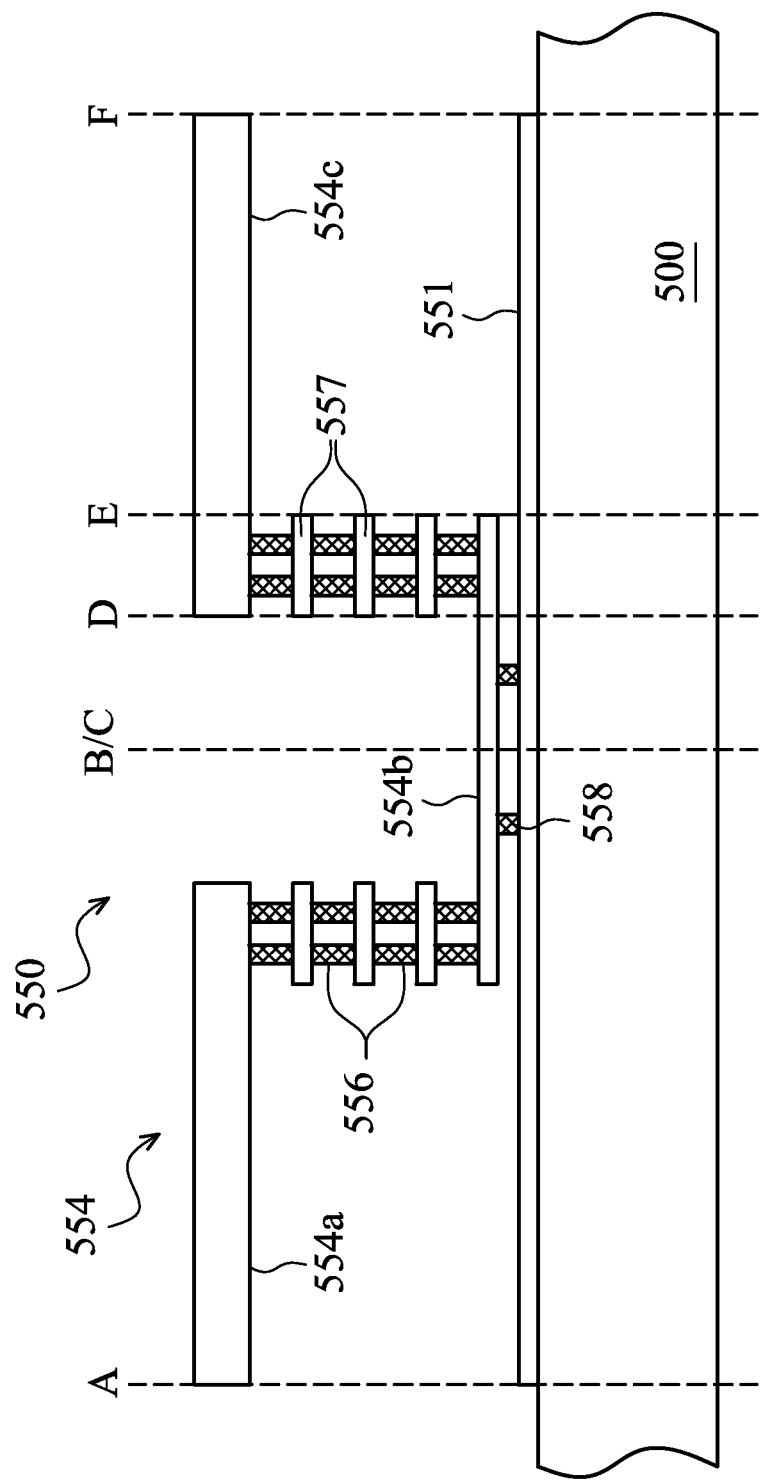

FIGS. 7A and 8A illustrate diagrammatic top views of test structures 300 and 400, respectively, each test structure including a device-under test (DUT) 301 and 401, respectively, embedded in the test structure. Test structures 300 and 400 may be similar to test structure 40 illustrated in FIGS. 2A-2B and may include similar elements having similar functions. The DUTs 301 and 401 may each include an active or a passive radio frequency (RF) device in the present embodiment. For example, the DUT may be a radio frequency integrated circuit (RFIC) device.

The test structures 300 and 400 each include test pads 302a and 302b, 304a and 304b, and 306a and 306b. The test pads 304a, 304b include signal test pads, and the test pads 302a, 302b and 306a, 306b include ground test pads. In the present embodiment, the test pads 302a, 304a, 306a and 302b, 304b, and 306b are respectively arranged in a ground-signal-ground (GSG) configuration, where the ground test pads 302a, 302b and 306a, 306b are proximate to the signal test pads 304a, 304b. In alternate embodiments, the test structures 300 and 400 may be implemented with other configurations for the test pads, such as ground-signal (GS), ground-signal-ground-signal-ground (GSGSG), and/or any other suitable testing configurations.

In FIG. 7A, the signal test pads 304a and 304b are electrically coupled to transmission lines 310 and 311, respectively. The transmission lines 310 and 311 are also coupled to the DUT 301. Thus, electrical connections between the DUT 301 and external devices may be established. Transmission lines 310, 311 may also be referred to as signal transmission lines or signal legs. The ground test pads 302a and 302b and ground test pads 306a and 306b are coupled to one another through conductive lines 308 and 312, respectively, which are transmission lines and may also be referred to as ground lines or ground legs. The ground test pads 302a, 302b and 306a, 306b and ground lines 308, 312, 314, 315 provide an electrical ground reference point for the DUT 301. The test pads 302a-306a and 302b-306b, the transmission lines 310 and 311, and the ground lines 308, 312, 314, and 315 each include a conductive material such as aluminum, copper, aluminum-copper alloys, aluminum alloys, copper alloys, other metals, polysilicon, and/or combinations thereof. In the present embodiment, the signal test pads and the ground test pads may have dimensions and be comprised of materials that are approximately the same. It is understood that the test pads 302a-306a and 302b-306b may be coupled to an external device, such as a tester, so that electrical connections between the DUT 301 and the external device may be established. The transmission lines 310 and 311 may be comprised of portions 310a, 310b and 311a, 311b, respectively, with portions 310a, 311a being adjacent signal test pads 304a, 304b, respectively, and with portions 310b, 311b being adjacent DUT 301. In one embodiment, portions 310a and 311a may have a larger width than portions 310b and 311b, respectively.

Similarly, in FIG. 8A, the signal test pads 304a and 304b are electrically coupled to transmission lines 410 and 411, respectively. The transmission lines 410 and 411 are also coupled to the DUT 401. Thus, electrical connections between the DUT 401 and external devices may be established. Transmission lines 410, 411 may also be referred to as signal transmission lines or signal legs. The ground test pads 302a and 302b and ground test pads 306a and 306b are coupled to one another through conductive lines 308 and 312, respectively, which are transmission lines and may also be referred to as ground lines or ground legs. The ground test pads 302a, 302b and 306a, 306b and ground lines 308, 312, 414, 415 provide an electrical ground reference point for the DUT 401. The test pads 302a-306a and 302b-306b, the transmission lines 410 and 411, and the ground lines 308, 312, 414, and 415 each include a conductive material such as aluminum, copper, aluminum-copper alloys, aluminum alloys, copper alloys, other metals, polysilicon, and/or combinations thereof. In the present embodiment, the signal test pads and the ground test pads may have dimensions and be comprised of materials that are approximately the same. It is understood that the test pads 302a-306a and 302b-306b may be coupled to an external device, such as a tester, so that electrical connections between the DUT 401 and the external device may be established. The transmission lines 410 and 411 may be comprised of portions 410a, 410b and 411a, 411b, respectively, with portions 410a, 411a being adjacent signal test pads 304a, 304b, respectively, and with portions 410b, 411b being adjacent DUT 401. In one embodiment, portions 410a and 411a may have a larger width than portions 410b and 411b, respectively.

Test structures 300 and 400 are similar but for the DUT geometry and the lengths of the corresponding transmission lines coupling the signal testing pads to the DUT. In the present embodiments, DUT 301 is longer in the "x" direction than in the "y" direction (FIG. 7A), and DUT 401 is longer in the "y" direction than in the "x" direction (FIG. 8A). Thus, in accordance with one embodiment, transmission lines 410, 411 have larger lengths than transmission lines 310, 311. In respective FIGS. 7A and 8A, transmission lines 310 and 410 are between planes A and B, DUT 301 and 401 are between planes B and C, and transmission lines 311 and 411 are between planes C and F. In both cases, de-embedding error in the x direction or the y direction may occur using conventional short dummy test structures.

DUT 301 and 401 each have intrinsic transmission parameters that represent true physical/electrical characteristics of the DUT. When the DUT 301 or 401 is tested to measure these intrinsic transmission parameters, the components that couple to the DUT 301 or 401—such as the signal testing pads (e.g., 302a-306a and 302b-306b) and the transmission lines (e.g., 310, 311 and 410, 411)—contribute parasitics, including parasitic resistance, parasitic capacitance, and parasitic inductance, to the measurement results, thus adversely affecting the accuracy of the measurements of the DUT. As such, various "de-embedding" methods have been utilized to extract the intrinsic transmission parameters of the DUT from the measurement results of the DUT. However, as testing frequencies increase, the parasitic contributions of the components coupling to the DUT become larger, which may render current de-embedding methods inaccurate. For example, a popular current de-embedding method utilizes an "open-short-through" approach, where in one aspect of the de-embedding, the DUT is removed from the test structure, and an extra electrical short connection is placed between plane B and plane C of the test structure. Since this electrical short connection may include metal and as such may contain resistance and inductance, it should not be de-embedded. However, the "open-short-through" de-embedding method does not take this into account and effectively de-embeds the electrical short connection from the measurement results. Consequently, the intrinsic transmission parameters of the DUT obtained using the "open-short-through" de-embedding method are not accurate. This phenomenon is referred to as "short over de-embedding," which means the resistance and inductance values that are removed during de-embedding are higher than the correct values that should have been removed. The "short over de-embedding" problem becomes especially pronounced at higher frequencies, for example at frequencies equal to or greater than 50 GHz. The "short over de-embedding" problem also gets worse as the electrical short connection becomes longer.

To overcome the limitations of the typical de-embedding methods, the present embodiment utilizes multiple test structures including an advantageous short dummy testing structure to obtain accurate results for the intrinsic transmission parameters of the DUT 301, 401. These multiple test structures may include the test structure 300, 320, 350, 400, 420, 450, and 550 as described above and further described below.

Figure 7B:
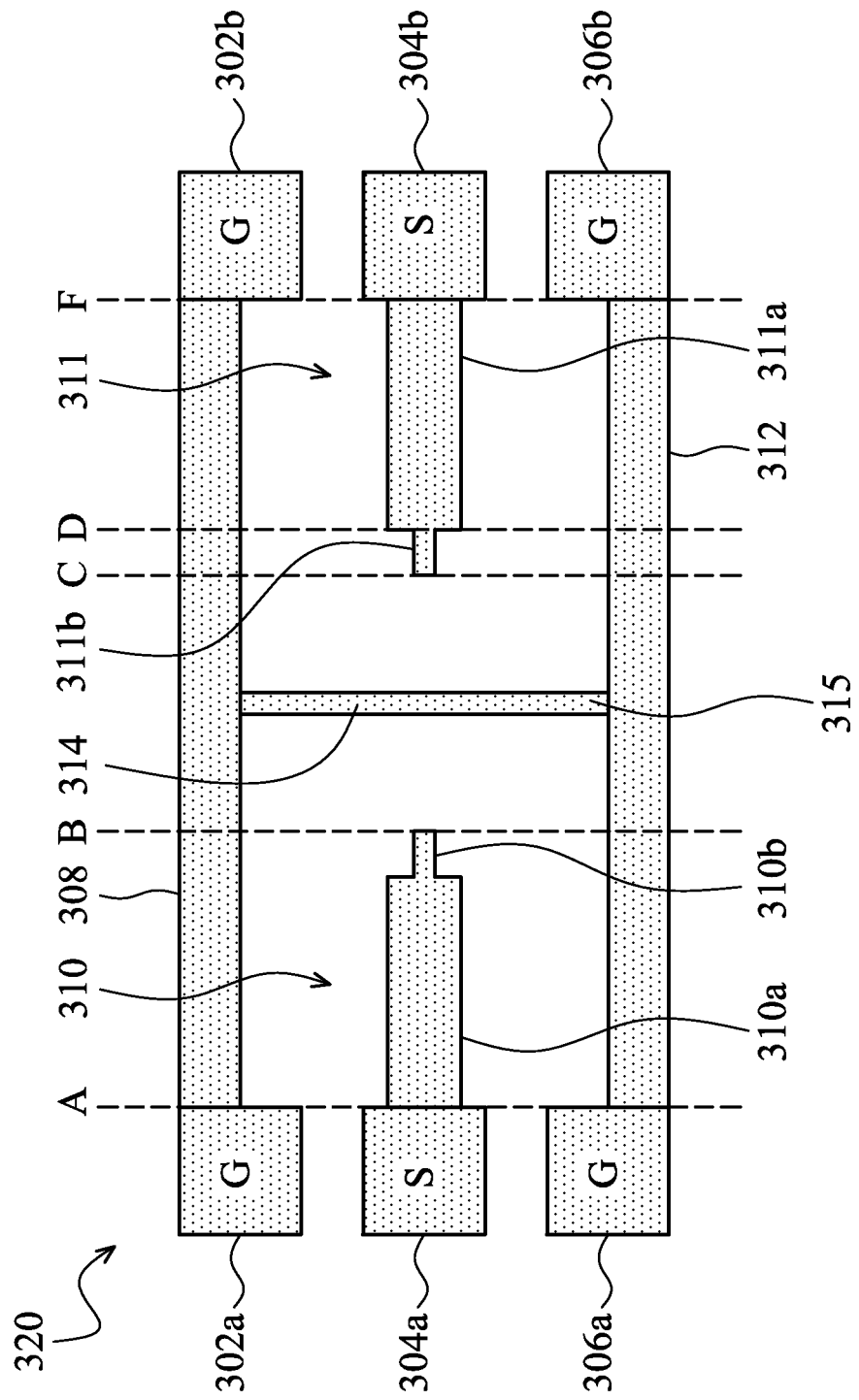
Figure 8B:
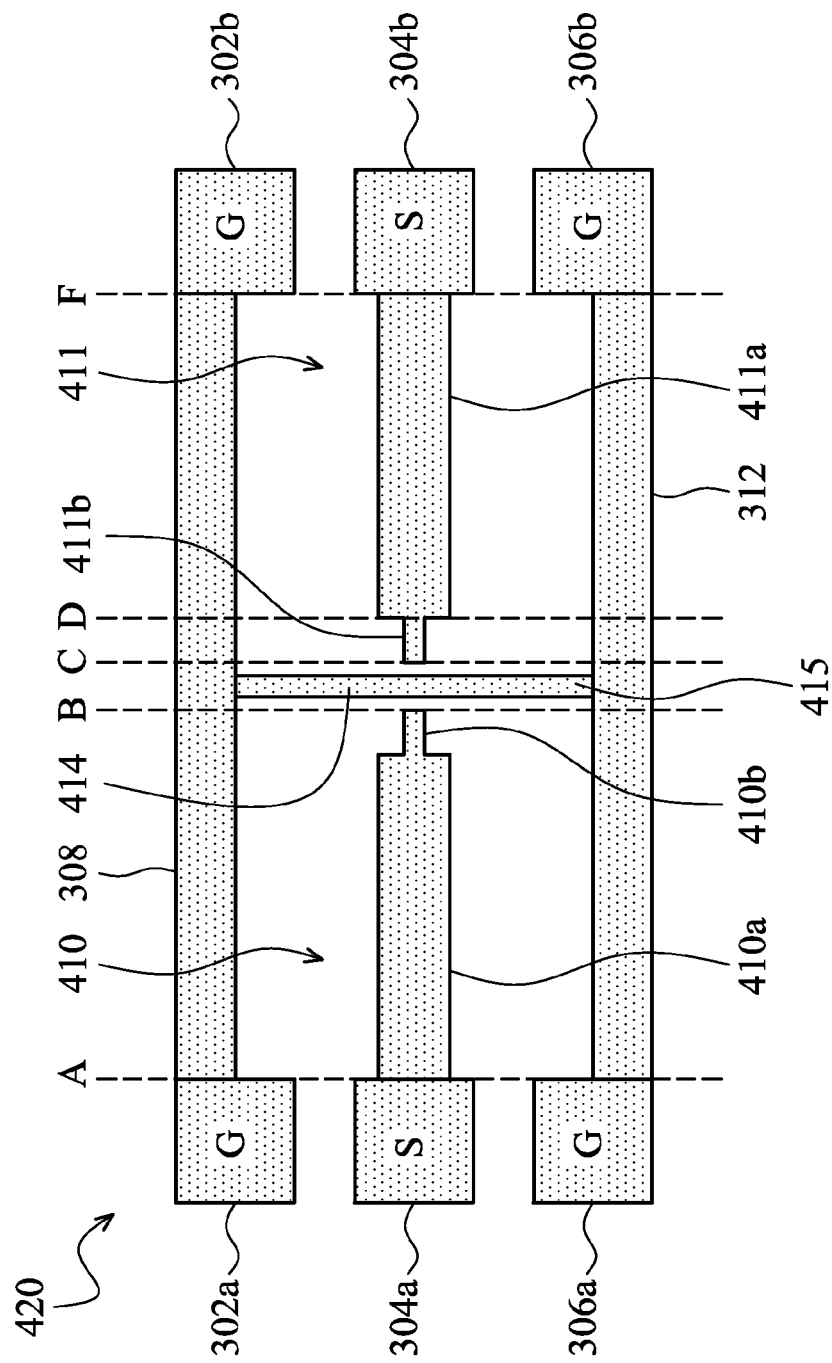

FIG. 7B illustrates an open dummy test structure 320 corresponding to test structure 300 with DUT 301, and FIG. 8B illustrates an open dummy test structure 420 corresponding to test structure 400 with DUT 401. Open dummy test structures 320 and 420 include similar ground test pads, signal test pads, and ground lines with similar structure and function as described above with respect to FIGS. 7A and 8A. However, DUT 301 and 401 are respectively removed from open dummy test structures 320 and 420 to form a gap between the signal transmission lines of 310, 311 and 410, 411, respectively, thereby forming an open signal transmission line comprised of lines 310 and 311.

Figure 7C:
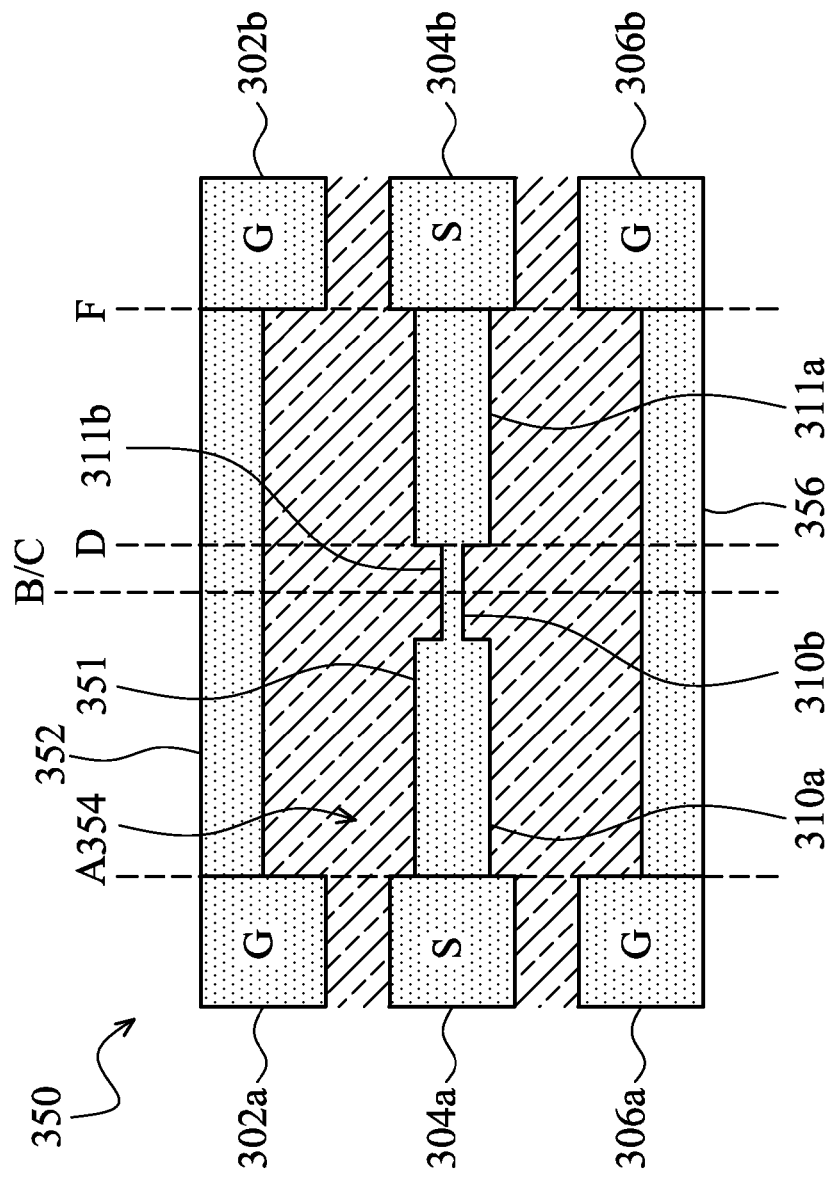
Figure 8C:
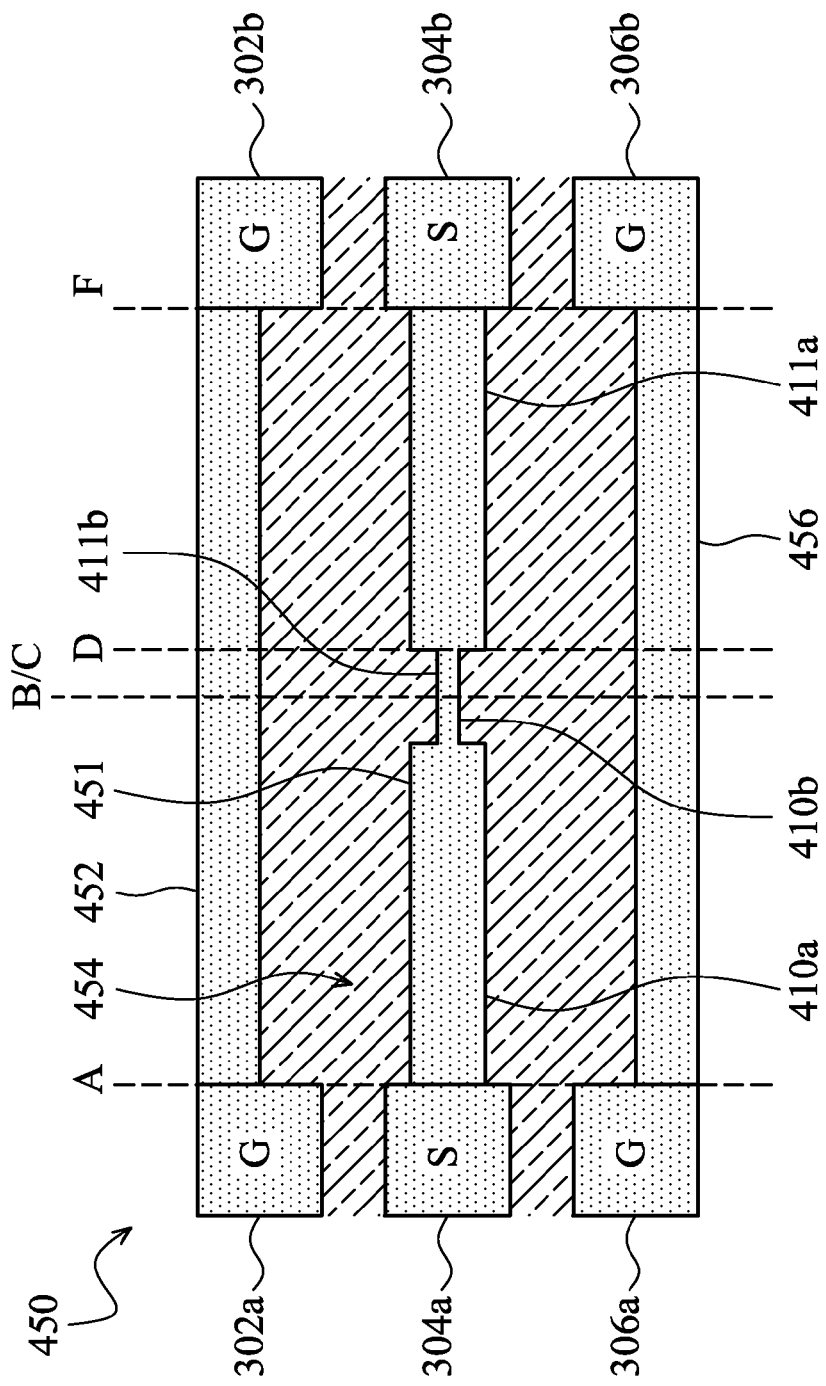

FIGS. 7C and 8C illustrate top views of advantageous short dummy test structures 350 and 450, respectively, that correspond to test structures 300 and 400, respectively, in accordance with various aspects of the present disclosure. FIGS. 9A and 9B illustrate a perspective view and a cross-sectional side view, respectively, of short dummy test structure 550 that may correspond to either test structure 300 or 400.

Short dummy test structures 350, 450, 550 include a grounded shield layer 351, 451, 551 respectively, above a substrate. The short dummy test structure 350 of FIG. 7C further includes at least two signal test pads 304a, 304b, and a signal transmission line 354 above the grounded shield layer 351 and between the two signal test pads 304a, 304b, wherein the signal transmission line 354 is electrically coupled to the grounded shield layer 351. The short dummy test structure 450 of FIG. 8C further includes at least two signal test pads 304a, 304b, and a signal transmission line 454 above the grounded shield layer 451 and between the two signal test pads 304a, 304b, wherein the signal transmission line 454 is electrically coupled to the grounded shield layer 451. The short dummy test structure 550 of FIGS. 9A-9B further includes at least two signal test pads 304a, 304b, and a signal transmission line 554 above the grounded shield layer 551 and between the two signal test pads 304a, 304b, wherein the signal transmission line 554 is electrically coupled to the grounded shield layer 551.

According to various aspects of the present disclosure, the grounded shield layers 351, 451, 551 may be comprised of a metal, such as aluminum or copper, and may have various widths and thicknesses. In accordance with one embodiment, grounded shield layers 351, 451, 551 are each beneath entire lengths of the signal transmission lines and ground lines. In other words, the signal transmission lines 354, 454, 554 may be disposed entirely above the grounded shield layer 351, 451, 551, respectively, according to various aspects of the present disclosure. Advantageously, in one embodiment, the short dummy test structures 350, 450, 550 are each designed and fabricated using such a substrate-shielded technique so that potential electromagnetic field radiation leakage to a semiconductor substrate (not illustrated) is reduced. In this substrate shielded technique, the short dummy test structures 350, 450, 550 are each fabricated on the substrate and includes a bottom metal plane that is grounded to shield the silicon substrate. A feature of this implementation is that the test structure 350, 450, 550 may be regarded as an independent network without being coupled to other networks. Furthermore, since the substrate is shielded by the grounded shield layer, no substrate network is added to the de-embedding equivalent circuit, simultaneously simplifying the equivalent circuit and the de-embedding methodology.

Furthermore, as shown in FIGS. 7A, 7C and 8A, 8C and 9A, 9B, the signal transmission lines 354, 454, 554 of the short dummy test structures 350, 450, 550, respectively, each have a smaller total length than a total length of the corresponding signal transmission line and a device-under-test (DUT) of a test structure including the DUT, in accordance with an embodiment of the present disclosure. For example, the length of signal transmission line 354 between planes A and F of short dummy test structure 350 is smaller than a total length of transmission lines 310, 311, and DUT 301 between planes A and F of test structure 300 (FIGS. 7A, 7C). Similarly, the length of signal transmission line 454 between planes A and F of short dummy test structure 450 is smaller than a total length of transmission lines 410, 411, and DUT 401 between planes A and F of test structure 400 (FIG. 8A, 8C).

Furthermore, as shown in FIGS. 7A, 7C and 8A, 8C and 9A, 9B, the signal transmission lines 354, 454, 554 of the short dummy test structures 350, 450, 550, respectively, each have a total length of about a combined length of a first transmission line and a second transmission line coupling a device-under-test (DUT) of a test structure in accordance with an embodiment of the present disclosure. For example, the length of signal transmission line 354 between planes A and F of short dummy test structure 350 is about the combined length of transmission line 310 between planes A and B and transmission line 311 between planes C and F (i.e., without DUT 301) of test structure 300 (FIGS. 7A, 7C). In one embodiment, transmission line 354 may be comprised of portions 310a, 310b, 311a, and 311b as described above with respect to FIG. 7A. Similarly, the length of signal transmission line 454 between planes A and F of short dummy test structure 450 is about the combined length of transmission line 410 between planes A and B and transmission line 411 between planes C and F (i.e., without DUT 401) of test structure 400 (FIGS. 8A, 8C). In one embodiment, transmission line 454 may be comprised of portions 410a, 410b, 411a, and 411b as described above with respect to FIG. 8A.

Similar to the prior test structures described above, the short dummy test structures 350, 450, 550 each include test pads 302a and 302b, 304a and 304b, and 306a and 306b. The test pads 304a, 304b include signal test pads, and the test pads 302a, 302b and 306a, 306b include ground test pads. In the present embodiment, the test pads 302a, 304a, 306a and 302b, 304b, and 306b are respectively arranged in a ground-signal-ground (GSG) configuration, where the ground test pads 302a, 302b and 306a, 306b are proximate to the signal test pads 304a, 304b. In alternate embodiments, the test structures 350, 450, 550 may be implemented with other configurations for the test pads, such as ground-signal (GS), ground-signal-ground-signal-ground (GSGSG), and/or any other suitable testing configurations.

In FIG. 7C, the signal test pads 304a and 304b are electrically coupled to one another through transmission line 354. The ground test pads 302a and 302b and ground test pads 306a and 306b are coupled to one another through conductive lines 352 and 356, respectively, which are transmission lines and may also be referred to as ground lines. The ground test pads 302a, 302b and 306a, 306b and ground lines 352, 356 provide an electrical ground reference point. The test pads 302a-306a and 302b-306b, the transmission line 354, and the ground lines 352, 356 may each include a conductive material such as aluminum, copper, aluminum-copper alloys, aluminum alloys, copper alloys, other metals, polysilicon, and/or combinations thereof. In the present embodiment, the signal test pads and the ground test pads may have dimensions and be comprised of materials that are approximately the same. It is understood that the test pads 302a-306a and 302b-306b may be coupled to an external device, such as a tester, so that measurements on short dummy test structure 350 may be determined.

Similarly, in FIG. 8C, the signal test pads 304a and 304b are electrically coupled to one another through transmission line 454. The ground test pads 302a and 302b and ground test pads 306a and 306b are coupled to one another through conductive lines 452 and 456, respectively, which are transmission lines and may also be referred to as ground lines. The ground test pads 302a, 302b and 306a, 306b and ground lines 452, 456 provide an electrical ground reference point. The test pads 302a-306a and 302b-306b, the transmission line 454, and the ground lines 452, 456 may each include a conductive material such as aluminum, copper, aluminum-copper alloys, aluminum alloys, copper alloys, other metals, polysilicon, and/or combinations thereof. In the present embodiment, the signal test pads and the ground test pads may have dimensions and be comprised of materials that are approximately the same. It is understood that the test pads 302a-306a and 302b-306b may be coupled to an external device, such as a tester, so that measurements on short dummy test structure 450 may be determined.

Similarly, in FIGS. 9A-9B, the signal test pads 304a and 304b are electrically coupled to one another through transmission line 554. The ground test pads 302a and 302b and ground test pads 306a and 306b are coupled to one another through conductive lines (e.g., line 552), which are transmission lines and may also be referred to as ground lines or ground legs. The ground test pads 302a, 302b and 306a, 306b and ground lines (e.g., line 552) provide an electrical ground reference point. The test pads 302a-306a and 302b-306b, the transmission line 554, and the ground lines (e.g., line 552) may each include a conductive material such as aluminum, copper, aluminum-copper alloys, aluminum alloys, copper alloys, other metals, polysilicon, and/or combinations thereof. In the present embodiment, the signal test pads and the ground test pads may have dimensions and be comprised of materials that are approximately the same. It is understood that the test pads 302a-306a and 302b-306b may be coupled to an external device, such as a tester, so that measurements on short dummy test structure 550 may be determined.

As further illustrated in FIGS. 9A-9B, signal transmission line 554 of short dummy test structure 550 includes a plurality of vias 556 and 558, and a plurality of conductive layers 554 (including conductive layers 554a, 554b, 554c) and 557 above grounded shield layer 551, all the elements of which are above substrate 500. The conductive layers may also be known as inter-level metallization layers, which may exist in a plurality of semiconductor devices. In one embodiment, the conductive layers and the vias include a conductive material such as metal, for example, aluminum, copper, aluminum-copper alloy, tungsten, or a combination thereof. In one embodiment, conductive layer 554b is electrically coupled to the grounded shield layer 551 by at least one via 558, thereby electrically coupling conductive layers 554a, 554c to grounded shield layer 551 through conductive layers 557 and vias 556. The conductive layers 554 and 557 may have various widths and thicknesses. Although three metal layers 557 are shown in FIG. 9B, the signal transmission line 554 is not limited to such a number, and more or less metal layers 557 (and corresponding vias) may be used. In other words, various levels of conductive layers may comprise signal transmission line 554.

In accordance with one embodiment of the present disclosure, ground lines (e.g., 552) and ground testing pads 302a, 302b and 306a, 306b each include a plurality of metal layers coupled by a plurality of vias. One of the plurality of metal layers may include a top metal layer over intermediate metal layer(s). A bottom metal layer of the ground lines and/or ground testing pads may be electrically coupled to the grounded shield layer 551 in accordance with one aspect of the present disclosure.

In one example, substrate 500 is a semiconductor substrate and may be comprised of silicon, or alternatively may include silicon germanium, gallium arsenic, or other suitable semiconductor materials. The substrate may further include doped active regions and other features such as a buried layer, and/or an epitaxy layer. Furthermore, the substrate may be a semiconductor on insulator such as silicon on insulator (SOI). In other embodiments, the semiconductor substrate may include a doped epitaxy layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a silicon substrate may include a multilayer compound semiconductor structure. The active region may be configured as an NMOS device (e.g., nFET) or a PMOS device (e.g., pFET). The semiconductor substrate may include underlying layers, devices, junctions, and other features (not shown) formed during prior process steps or which may be formed during subsequent process steps.

Although not shown, dielectric layers, such as oxides, may be deposited between the transmission line conductive layers, the vias, and/or between substrate 500 and grounded shield layer 551, in one example.

In one embodiment, the test structures 300, 320, 350, 400, 420, 450, and/or 550 are formed on the same semiconductor wafer. The test structures may also be fabricated using the same technologies and processes (for example, a 65 nm RF-CMOS technology) in the present embodiment. It is also understood that the DUT may be formed along with the forming of a test structure. In alternative embodiments, the test structures may be fabricated using different processes and/or may be formed on different wafers.

Advantageously, redundant metal strips in the x or y direction of a conventional short dummy test structure is removed and the remaining transmission lines are joined to decrease transmission line lengths of both the signal and ground lines, thereby forming improved short dummy test structures with grounded shield layers above the substrate to substantially eliminate over de-embedding in the x and/or y direction.

Figure 10:
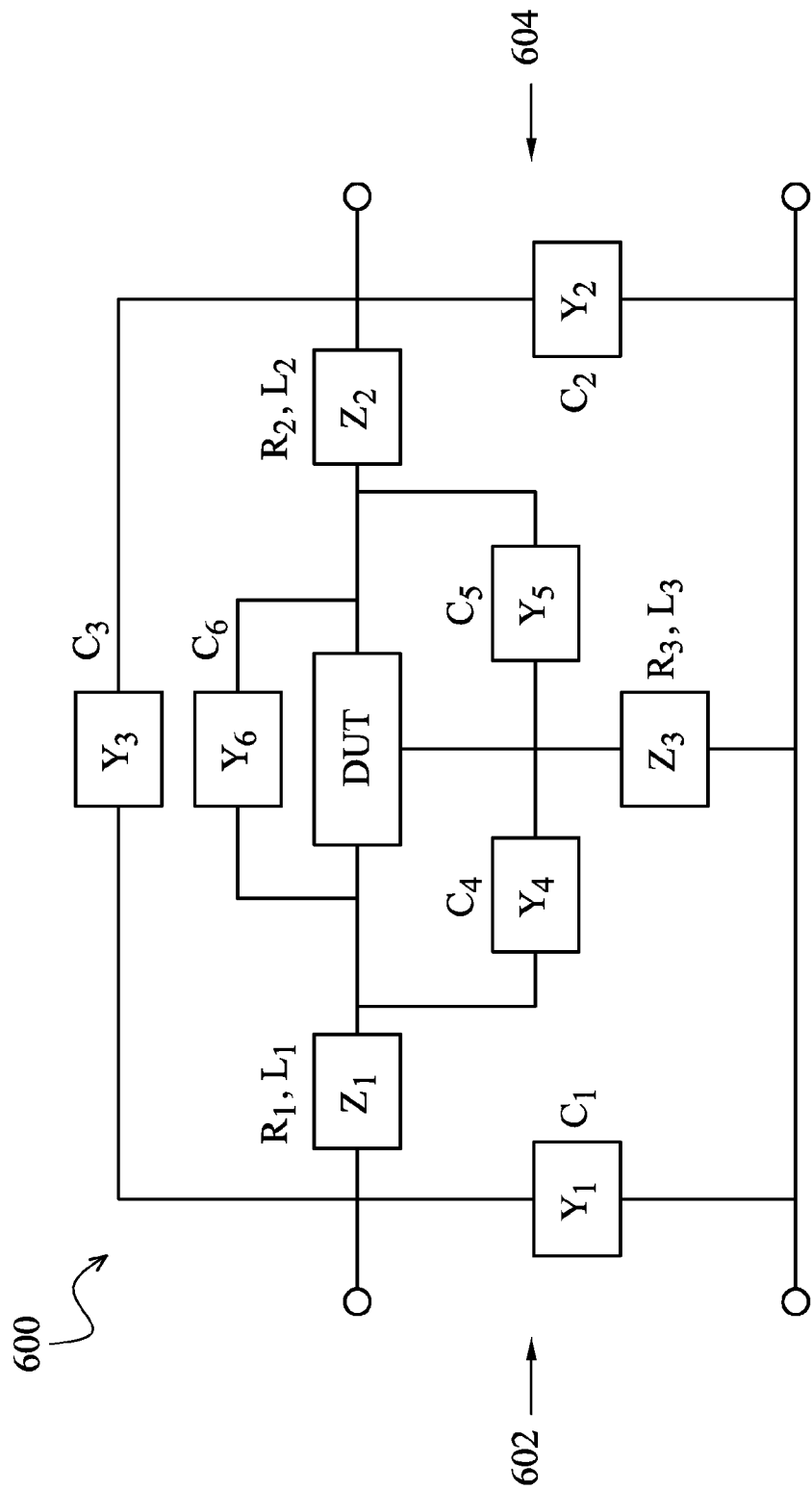
FIG. 10 illustrates an equivalent circuit showing parasitics of a test structure to be de-embedded in accordance with an embodiment of the present disclosure.

Referring now to FIG. 10, an equivalent circuit 600 shows parasitics of a test structure (e.g., test structures 300, 400) to be de-embedded in accordance with an embodiment of the present disclosure. $Y_1$, $Y_2$, and $Y_3$ represent the coupling capacitances $C_1$, $C_2$, and $C_3$, respectively, between the pad of a first port 602 (e.g., an input port) and the ground shields, between the pad of a second port 604 (e.g., an output port) and the ground shields, and between first port 602 and second port 604, respectively. $Y_4$, $Y_5$, and $Y_6$ represent the coupling capacitances $C_4$, $C_5$, and $C_6$, respectively, between a left signal leg (e.g., signal transmission lines 310, 410) and the ground shields, a right signal leg (e.g., signal transmission lines 311, 411) and the ground shields, and the left signal leg and the right signal leg, respectively. $Z_1$ and $Z_2$ represent the series impedances of the left signal leg and the right signal leg from first port 602 and second port 604, respectively, and $Z_3$ represents the series impedance of the ground legs connected to ground.

The capacitances ($C_n$) can be extracted from the open dummy measurement and area ratio of the pads ($A_x/(A_y+A_z)$) and the interconnections, and the resistances ($R_a$) and inductances ($L_n$) can be extracted from the matrix manipulation of the open and short dummy measurement, utilizing example equations as shown below in accordance with one embodiment of the present disclosure. $[Y_O]$ and $[Y_S]$ represent the Y-parameters of an open dummy test structure and a short dummy test structure, respectively.

$$C_1+C_4=(1/\omega)\text{imag}(Y_{11O}+Y_{12O})$$

$$C_2+C_5=(1/\omega)\text{imag}(Y_{22O}+Y_{12O})$$

$$C_1=(C_1+C_4)*A_1/(A_1+A_4)$$

$$C_4=(C_1+C_4)*A_4/(A_1+A_4)$$

$$C_2=(C_2+C_5)*A_2/(A_2+A_5)$$

$$C_5=(C_2+C_5)*A_5/(A_2+A_5)$$

$$C_3=C_6=0.5*(-1/\omega)\text{imag}(Y_{12O})$$

$$Z_{SO}=Y_{SO}^{-1}=(Y_S-Y_O)^{-1}$$

$$R_1=\text{real}(Z_{11SO}-A_{12SO})$$

$$L_1=(1/\omega)\text{imag}(Z_{11SO}-Z_{12SO})$$

$$R_2=\text{real}(Z_{22SO}-Z_{12SO})$$

$$L_2=(1/\omega)\text{imag}(Z_{22SO}-Z_{12SO})$$

$$R_3=\text{real}(Z_{12SO})$$

$$L_3=(1/\omega)\text{imag}(Z_{12SO})$$

Figure 11:
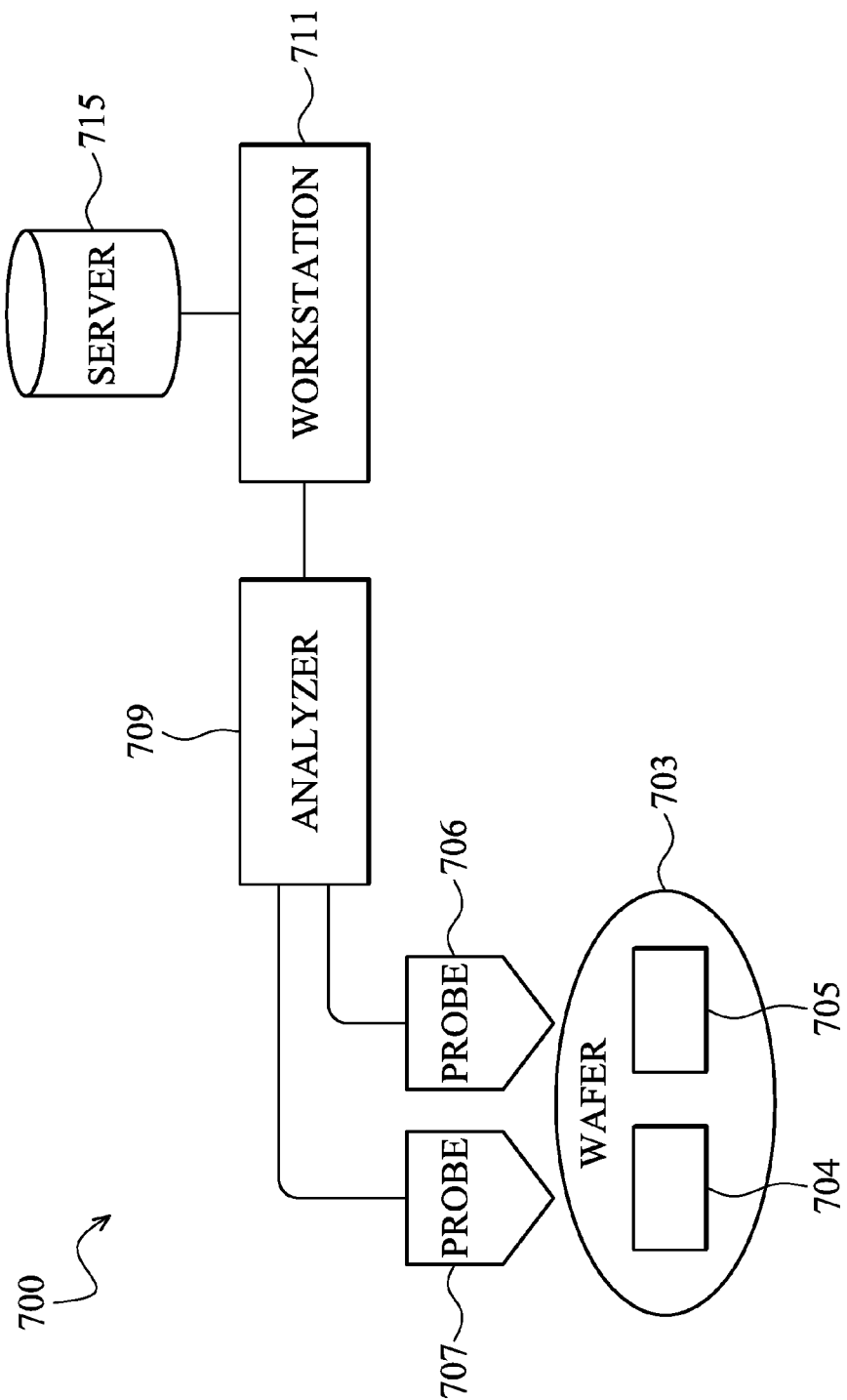
FIG. 11 is a block diagram of a system for obtaining intrinsic characteristics of a DUT in accordance with an embodiment of the present disclosure.

Referring now to FIG. 11, a block diagram illustrates a system 700 for obtaining intrinsic characteristics of a DUT in accordance with an embodiment of the present disclosure. A DUT is located in a test structure 705 fabricated on the substrate of wafer 703. Test structures 704 (e.g., a short dummy test structure, an open dummy test structure, a thru dummy test structure, and/or other dummy test structures) are also located on wafer 703. Probes 706 and 707 are used to obtain S parameter data from structures 704 and structure 705. The probes are operably coupled to a calibrated automatic network analyzer 709. Network analyzer 709 is controlled by software running on a workstation 711. The software may be downloaded from storage media (e.g. hard drives) of a server 715 by workstation 711. In other embodiments, the software may be located on a hard drive of a personal computer system or downloaded from a removable media (e.g. CD-Rom). The workstation 711 executes the software to control the analyzer 709, thereby executing one or more of the methods described herein.

Figure 12:
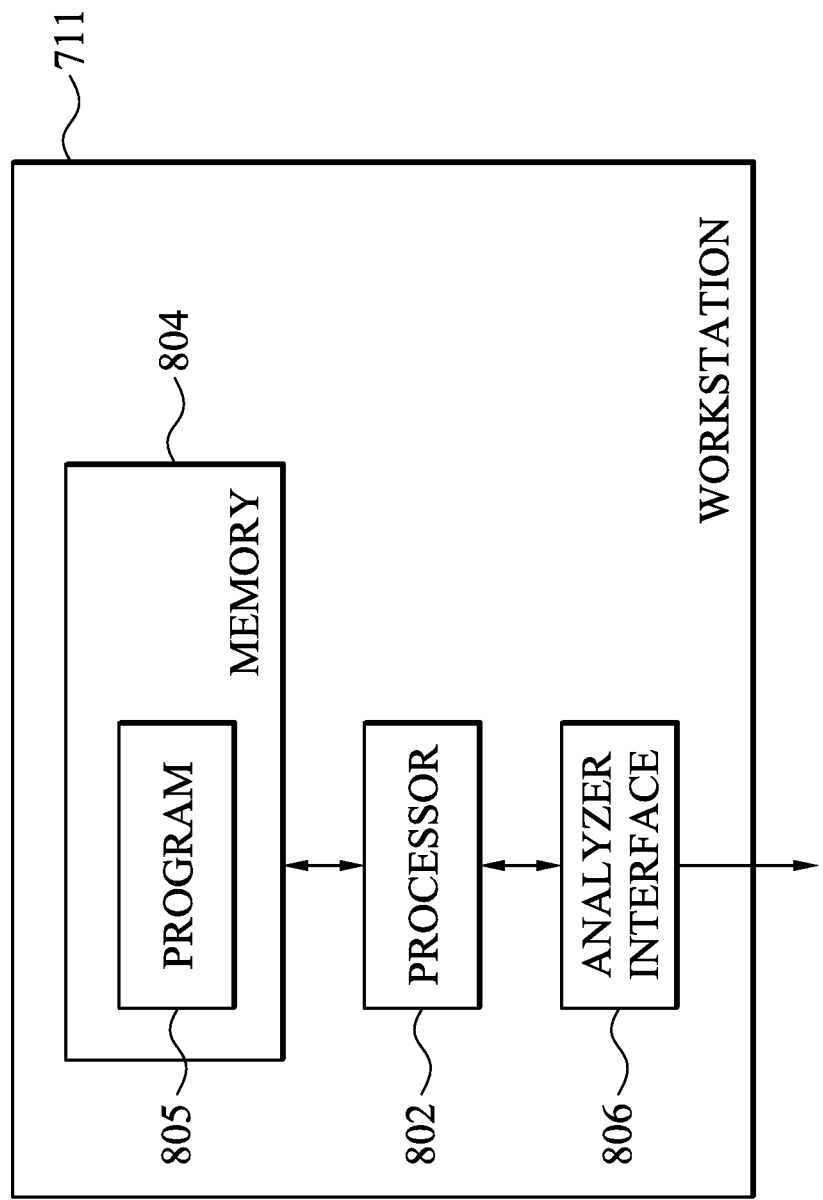
FIG. 12 is a block diagram of a workstation of the system of FIG. 11 in accordance with an embodiment of the present disclosure.

FIG. 12 illustrates a block diagram of workstation 711 in accordance with an embodiment of the present disclosure. The workstation 711 includes a processor 802, a memory 804, and an analyzer interface 806. The memory 804 is accessible to the processor 802. In addition, the analyzer interface 806 is connected to the processor 802.

The processor 802 can be a microprocessor, controller, or other processor capable of executing a series of instructions. The memory 804 is a computer readable medium such as random access memory (RAM), non-volatile memory such as flash memory or a hard drive, and the like. The memory 804 stores a program 805 including a set of instructions to manipulate the processor 802 to perform one or more of the methods disclosed herein. For example, the program 805 can manipulate the processor 802 to control the analyzer interface 806 and can be used to store data, including test results. Via the analyzer interface 806, the processor 802 controls the analyzer 709 (FIG. 11) to determine the intrinsic characteristics of a device-under-test, as described herein. The intrinsic characteristics can be stored in the memory 804. It will be appreciated that other types of systems can be used in other embodiments to execute one or more of the methods described herein.

The present disclosure provides for various advantageous methods and apparatus of de-embedding. One of the broader forms of the present disclosure involves a short dummy test structure. The short dummy test structure includes a grounded shield layer above a substrate, at least two signal test pads, and a signal transmission line above the grounded shield layer and between the two signal test pads, wherein the signal transmission line is electrically coupled to the grounded shield layer. In one embodiment, the signal transmission line has a smaller total length than a total length of a corresponding signal transmission line and a device-under-test (DUT) of a test structure including the DUT.

Another of the broader forms of the present disclosure involves an apparatus of de-embedding that includes a test structure including a device-under-test (DUT) coupled to a left signal pad by a first transmission line and a right signal pad by a second transmission line, and a short dummy test structure. The short dummy test structure includes a grounded shield layer above a substrate, at least two signal test pads, and a third signal transmission line above the grounded shield layer and between the two signal test pads. The third signal transmission line is electrically coupled to the grounded shield layer, and has a smaller total length than a total length of the first transmission line, the DUT, and the second transmission line.

Yet another of the broader forms of the present disclosure involves a method of de-embedding that includes forming a test structure including a device-under-test (DUT) coupled to a left signal pad by a first transmission line and a right signal pad by a second transmission line, and forming a plurality of dummy test structures. At least one dummy test structure is a short dummy test structure including a grounded shield layer above a substrate, at least two signal test pads, and a third signal transmission line above the grounded shield layer and between the two signal test pads, wherein the third signal transmission line is electrically coupled to the grounded shield layer, and wherein the third signal transmission line has a smaller total length than a total length of the first transmission line, the DUT, and the second transmission line. The method further includes measuring transmission parameters of the test structure and the dummy test structures including the short dummy test structure, and determining intrinsic transmission parameters of the DUT using the transmission parameters of the test structure and the plurality of dummy test structures including the short dummy test structure.

Advantageously, redundant metal strips in the x or y direction of a conventional short dummy test structure is removed and the remaining transmission lines are joined to decrease transmission line lengths of both the signal and ground lines, thereby forming improved short dummy test structures with grounded shield layers above the substrate to substantially eliminate over de-embedding in the x and/or y direction. The present disclosure further provides for enhanced accurate device characterization without requiring additional dummy test structures. Thus, the present disclosure simultaneously solves the over de-embedding phenomenon in both the x and y directions, complicated substrate effects, and the de-embedding uncertainties in small device de-embedding without increasing the complexity of the de-embedding procedure, thereby enabling more accurate RF models at high frequencies.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A short dummy test structure, comprising:
a grounded shield layer above a substrate;
at least two signal test pads; and
a signal transmission line above the grounded shield layer and between the two signal test pads, wherein the signal transmission line comprises a lower conductive layer and upper conductive layers that are adjacent to the signal test pads, wherein the lower conductive layer is not collinear with the upper conductive layers, electrically couples the upper conductive layers to the grounded shield layer and is parallel and in between the upper conductive layers, and wherein the signal transmission line has a smaller total length than a total length of a corresponding signal transmission line and a device-under-test (DUT) of a test structure including the DUT.

2. The test structure of claim 1, wherein the lower conductive layer is adjacent the grounded shield layer.

3. The test structure of claim 1, wherein the entire signal transmission line is above the grounded shield layer.

4. The test structure of claim 1, wherein the signal transmission line has a total length of a combined length of a first transmission line and a second transmission line coupling a device-under-test (DUT) of a test structure.

5. The test structure of claim 1, wherein the signal transmission line includes a plurality of vias and a plurality of conductive layers.

6. The test structure of claim 1, wherein the signal transmission line is electrically coupled to the grounded shield layer by at least one via.

7. The test structure of claim 1, further comprising a plurality of ground lines running in parallel to the signal transmission line, each ground line disposed between two ground test pads and electrically coupled to the grounded shield layer, wherein the signal test pads and the ground test pads have a ground-signal-ground configuration.

8. An apparatus, comprising:
a test structure including a device-under-test (DUT) coupled to a left signal pad by a first transmission line and a right signal pad by a second transmission line;
a short dummy test structure, including:
a grounded shield layer above a substrate;
at least two signal test pads; and
a third signal transmission line above the grounded shield layer and between the two signal test pads, wherein the third signal transmission line comprises a lower conductive layer and upper conductive layers that are adjacent to the signal test pads, wherein the lower conductive layer is not collinear with the upper conductive layers, electrically couples the upper conductive layers to the grounded shield layer and is parallel and in between the upper conductive layers, and wherein the third signal transmission line has a smaller total length than a total length of the first transmission line, the DUT, and the second transmission line.

9. The apparatus of claim 8, wherein the entire third signal transmission line is above the grounded shield layer.

10. The apparatus of claim 8, wherein the third signal transmission line has a total length of a combined length of the first transmission line and the second transmission line.

11. The apparatus of claim 8, wherein the third signal transmission line includes a plurality of vias and a plurality of conductive layers.

12. The apparatus of claim 8, wherein the third signal transmission line is electrically coupled to the grounded shield layer by at least one via.

13. The apparatus of claim 8, wherein the test structure and the short dummy test structure each include a plurality of ground lines running in parallel to the first, second, and third signal transmission lines, each ground line disposed between two ground test pads, wherein the signal test pads and the ground test pads have a ground-signal-ground configuration in each of the test structure and the short dummy test structure.

14. The apparatus of claim 8, further comprising an open dummy test structure, wherein the test structure, the short dummy test structure, and the open dummy test structure are all formed on a same semiconductor wafer.

15. A method of de-embedding, comprising:
forming a test structure including a device-under-test (DUT) coupled to a left signal pad by a first transmission line and a right signal pad by a second transmission line;
forming a plurality of dummy test structures, at least one dummy test structure being a short dummy test structure including a grounded shield layer above a substrate, at least two signal test pads, and a third signal transmission line above the grounded shield layer and between the two signal test pads, wherein the third signal transmission line comprises a lower conductive layer and upper conductive layers that are adjacent to the signal test pads, wherein the lower conductive layer is not collinear with the upper conductive layers, electrically couples the upper conductive layers to the grounded shield layer and is parallel and in between the upper conductive layers, and wherein the third signal transmission line has a smaller total length than a total length of the first transmission line, the DUT, and the second transmission line;
measuring transmission parameters of the test structure and the dummy test structures including the short dummy test structure; and
determining intrinsic transmission parameters of the DUT using the transmission parameters of the test structure and the plurality of dummy test structures including the short dummy test structure.

16. The method of claim 15, wherein the lower conductive layer is adjacent the grounded shield layer.

17. The method of claim 15, wherein the third signal transmission line is formed entirely above the grounded shield layer.

18. The method of claim 15, wherein the third signal transmission line is formed to have a total length of a combined length of the first transmission line and the second transmission line.

19. The method of claim 15, wherein the third signal transmission line is formed to include a plurality of vias and a plurality of conductive layers, and wherein the third signal transmission line is electrically coupled to the grounded shield layer by at least one via.

20. The method of claim 15, wherein the intrinsic transmission parameters of the DUT are determined using an open-short de-embedding technique or an open-short-through de-embedding technique.

* * * * *